(12) United States Patent
Loss et al.

(10) Patent No.: US 7,180,087 B1
(45) Date of Patent: Feb. 20, 2007

(54) SPIN FILTER AND A MEMORY USING SUCH A SPIN FILTER

(75) Inventors: Daniel Loss, Basel (CH); Patrik Recher, Basel (CH); Eugene V Sukhorukov, Petit-Lancy (CH)

(73) Assignee: ETeCH AG, Zurich (CH)

( * ) Notice: Subject to any disclaimer, the term of this patent is extended or adjusted under 35 U.S.C. 154(b) by 437 days.

(21) Appl. No.: 10/363,292

(22) PCT Filed: Sep. 6, 2000

(86) PCT No.: PCT/GB00/03422

§ 371 (c)(1),
(2), (4) Date: Nov. 18, 2003

(87) PCT Pub. No.: WO02/19435

PCT Pub. Date: Mar. 7, 2002

(30) Foreign Application Priority Data

Aug. 30, 2000 (GB) .................................. 0021302.5

(51) Int. Cl.
*H01L 29/06* (2006.01)
(52) U.S. Cl. ...................... 257/9; 257/E29.01; 977/933
(58) Field of Classification Search .................... 257/9; 977/933
See application file for complete search history.

(56) References Cited

OTHER PUBLICATIONS

Ching Ray Chang, Sui-Pin Chen, "Spin Polarized Tunneling through Ferromagnetic Barrier", Feb. 10, 1998, Chinese Journal of Physics, vol. 36, p. 85-90.*
Kinshuk Majumdar, Selman Hershfield, Magnetoresistance of double-tunnel-junction Coulomb blockade with magnetic metals□□Physical Review B, vol. 57p. 11521-11525.*

* cited by examiner

*Primary Examiner*—B. William Baumeister
*Assistant Examiner*—Matthew L. Reames
(74) *Attorney, Agent, or Firm*—Lilling & Lilling; Bruce E. Lilling; Sean Liam Kelleher

(57) ABSTRACT

A spin filtering device has: a spin filter (1) having an input region (3) for carrying an electron current, an output region (4) for carrying an electron current, and a three-dimensionally confined quantum region (2a) arranged to operate in the Coulomb blockade regime and separating the input and output regions (3 and 4) whereby electrons can only pass from the input region to the output region by tunnelling through the quantum region; and Zeeman splitting means (5) for causing Zeeman splitting in the spin filter, the quantum region (2a) and input and output regions (3 and 4) being formed such that the Zeeman splitting in the input and output regions (3 and 4) is less than the Fermi energy such that, in operation, the spin filter outputs a tunnelling current predominantly of one spin polarity. The direction of Zeeman splitting may be controlled to control the predominant spin polarity.

17 Claims, 14 Drawing Sheets

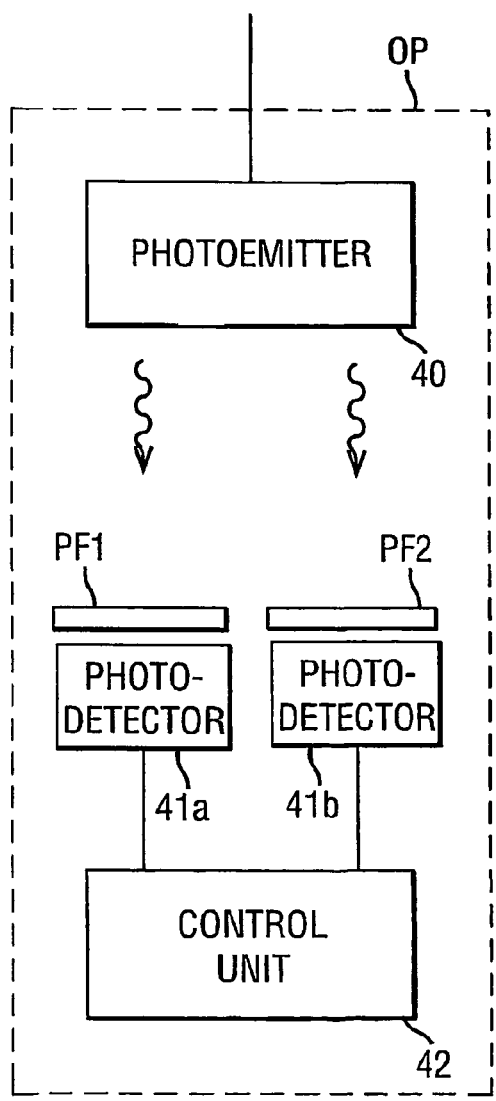
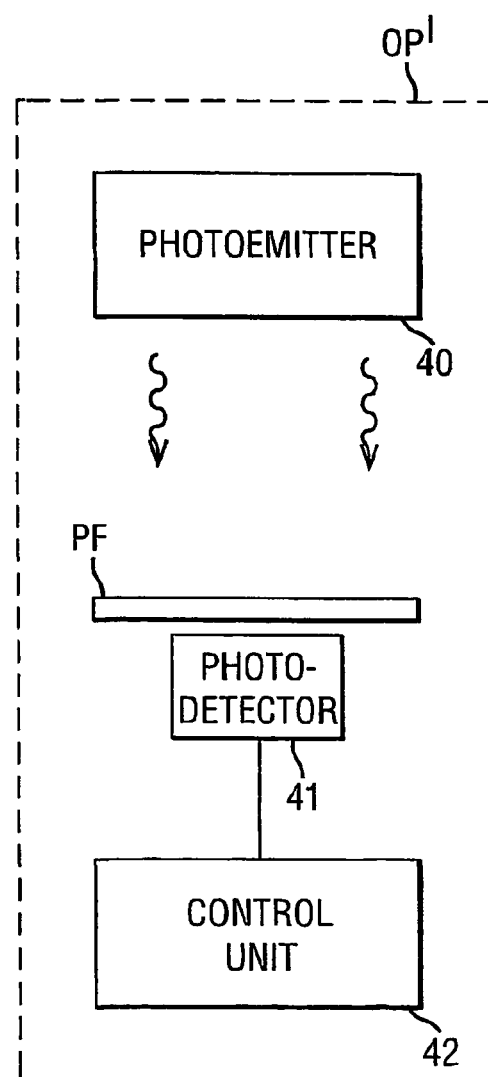

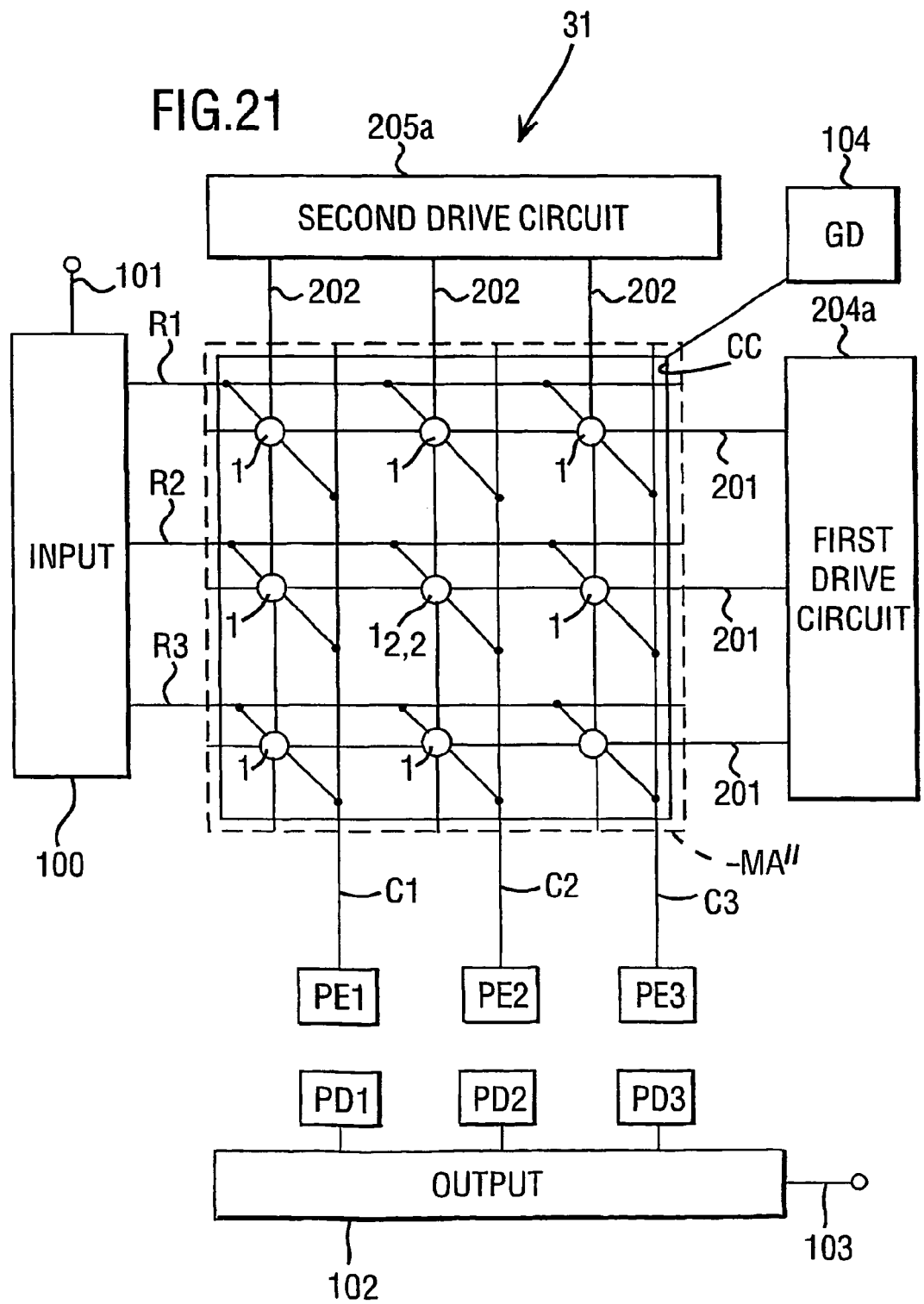

SPIN FILTER AND A MEMORY USING SUCH A SPIN FILTER

This invention relates to a spin filter and a memory using such a spin filter.

The demands of the computer industry and information technology in general require larger and larger memories operating at ever higher speeds. However, conventional memory such as dynamic random access memory (DRAM) that uses conventional semiconductor FET structures and capacitors for storing information as charge is reaching its operational size limit. Thus, although current x-ray, electronic beam and like lithography techniques would enable further shrinkage of memory size dimensions, this is not permitted because of restrictions on the capacitor and FET size.

There is increasing interest in the use of electron spin rather than charge for data manipulation and storage. An increasing number of experiments have shown that electron spin provides new ways of information processing and storage as discussed in, for example, the review article entitled "Magnetoelectronics" by Gary Prinz in Science Volume 282 pages 1660 to 1663 on 27 Nov. 1998 and in the article entitled "Electron spin and Optical coherence in Semiconductors" by David Awschalom and James Kikkawa in the June 1999 edition of Physics Today at pages 33 to 38 and, for example, the letter to Nature by the same authors published in volume 397 of Nature at pages 139 to 141. There is also considerable interest in spin-related phenomena for conventional as well as quantum computing as described in the article published in Physical Review A Volume 57 No. 1 at pages 120 to 126 by Daniel Loss and David DiVincenzo. Interest in spin-based information processing has also been considerably increased by recent experimental results in which spin coherence over macroscopic distances (typically one hundred micrometers) and spin dephasing times of 100s of nanoseconds have been observed.

Various proposals have been made for spin-based devices that offer advances in packing density, speed and/or other properties over conventional charge-based memory devices. For example, U.S. Pat. No. 6,021,065 describes a digital data memory device that consists of anisotropic ferromagnetic thin film memory structures providing a spin-dependent tunnelling memory. In addition U.S. Pat. No. 5,801,984 proposes the use of a magnetic tunnel junction device as a memory cell and U.S. Pat. No. 5,654,566 describes spin-based logic devices. All of these devices are multi-electron devices. Single electron devices including quantum dot devices and single electron transistors have, however, been proposed and EP-A-0697737 describes quantum dot computing elements that operate using the spin states of two single electrons on neighbouring quantum dots coupled by an anti-ferromagnetic material.

It is an aim of the present invention to provide a spin filter and an opto-electronic spin read-out device that operates at the single spin level.

An aspect of the present invention provides a spin filter comprising a three-dimensionally quantum confined region arranged to operate in the Coulomb blockage regime coupled by tunnel barriers to input and output Fermi leads whereby application of a magnetic field causes Zeeman splitting in the quantum confined region and any Zeeman splitting in the Fermi leads is such that only a fraction, if any, of the current in the Fermi leads is spin-polarised but conduction through the quantum confined region occurs primarily by sequential tunnelling of electrons having only one spin polarisation. The spin polarisation of an electron in the quantum confined region and thus the spin polarisation of the current through the spin filter may be controlled by the applied magnetic field.

The present invention thus provides a spin filter that enables charge carriers of only one spin polarity to pass through the filter.

The output of the spin filter may be coupled to a photoemissive device that emits either right or left circularly polarised photons dependent on the spin state of the current output by the filter. Polarisation dependent photodetectors may be used to detect the polarisation of the photons.

A spin filter embodying the invention in combination with a photoemissive device and a polarisation dependent photodetector may be used as a memory device.

A two-dimensional or even three-dimensional array of such memory devices may be produced to provide a dynamic random access memory device. A non-volatile memory device may be provided by arranging a hard magnetic layer, magnetic nano-particle, magnetic impurity or layer of nuclear spins providing an Overhauser field in close proximity to the quantum confined region.

A spin filter embodying the invention may also be used as a switch with the spin polarisation of the current output by the spin filter being dependent on the applied magnetic field.

Embodiments of the present invention will now be described, by way of example, with reference to the accompanying drawings in which:—

FIGS. 3 and 4 show functional block diagrams of two different examples of output devices for a spin filtering device embodying the invention;

FIG. 21 shows a functional diagram of another example of a two-dimensional memory embodying the invention.

Figure 1:
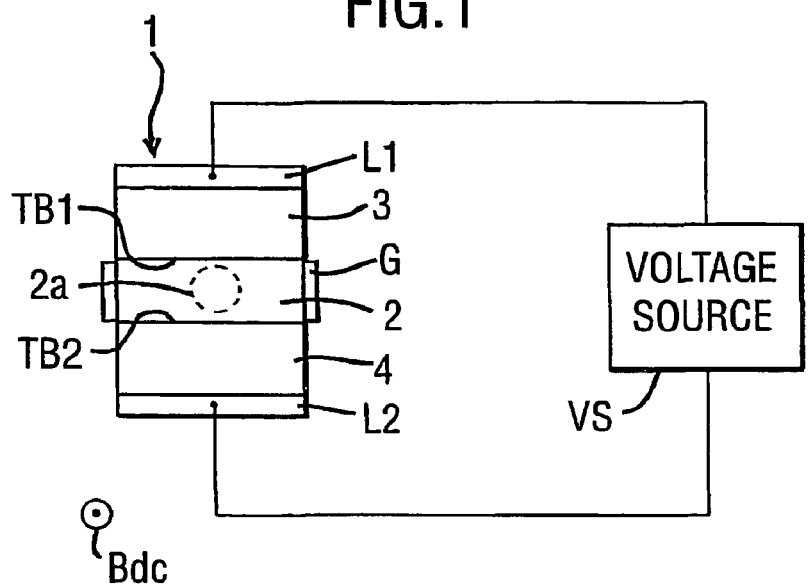
FIG. 1 shows a very diagrammatic functional diagram of the apparatus incorporating a spin filtering device embodying the invention.
Figure 2:
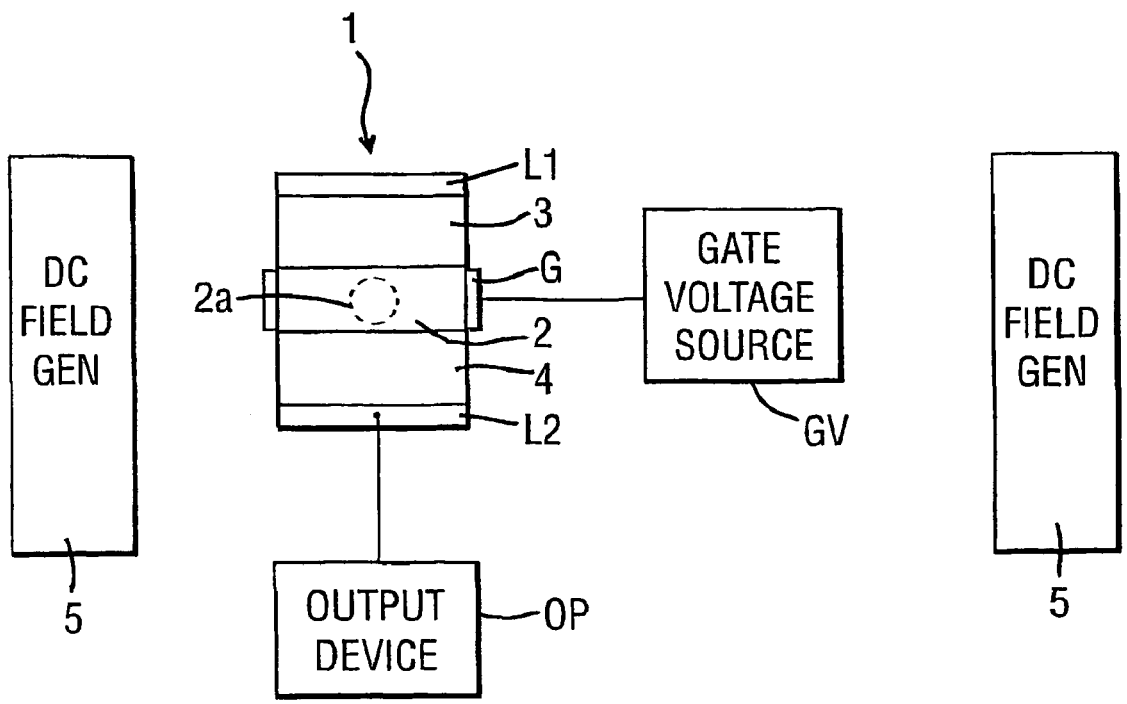
FIG. 2 shows a side view of the apparatus shown in FIG. 1.

Referring now to FIGS. 1 and 2, there are shown simplified diagrams for illustrating functional elements of a spin filtering device 1 embodying the invention.

The spin filtering device 1 comprises a three-dimensionally quantum confined region in the form of a quantum dot 2a in a quantum dot region 2 coupled by tunnel barriers TB1 and TB2 to respective input and output Fermi leads 3 and 4 formed by highly doped semiconductor regions.

The quantum dot is configured to operate in the Coulomb blockade regime which is discussed in detail in, for example, section 2.1 at pages 114 to 118 of the chapter entitled "Electron transport in quantum dots" by Kouwenhoven et al in the review text book entitled "Mesoscopic Electron Transport" edited by Sohn, Kouwenhoven, and Schön (ISBN No. 0-7923-4737-4).

The quantum dot region 2 and Fermi leads 3 and 4 are formed of materials such that the Fermi leads 3 and 4 have a g-factor smaller than that of the quantum dot region 2.

A DC magnetic field generator (FIG. 2) 5 is provided for inducing Zeeman splitting in the quantum dot.

The input and output Fermi leads 3 and 4 are coupled to respective contacts L1 and L2 between which a voltage source VS is coupled. An annular gate G contacts the quantum dot region 2 and is coupled to a gate voltage source GV.

An output device OP is coupled to contact L2 to receive a spin filtered current from the spin filtering device.

The device 1 may be manufactured using conventional quantum dot manufacturing techniques such as, for example MBE (molecular beam epitaxy) or MOCVD (metal organic chemical vapour deposition) and lithographic techniques such as x-ray or electron beam lithography.

The DC magnetic field generator 5 is required to generate a homogenous DC magnetic field of the order of at most a few Tesla. The DC magnetic field generator 5 may, therefore, consist of a commercially available nanomagnet. As other possibilities, the DC magnetic field generator 5 may be provided in a manner similar to that used for IBM magnetic storage discs or dysprosium dots may be used. Where nanomagnets or dysprosium dots are used, then these may be integrated with the device 1. As another possibility, a superconducting magnet may be used as the DC magnetic field generator 5. Dependent upon the g-factor of the quantum dot region 2, the magnetic fields required may be provided by, for example, permanent magnets or even electrically driven solenoids.

FIG. 3 shows one example of an output device OP that may be used with the spin filtering device 1 shown in FIGS. 1 and 2. In this example, the output device comprises a photoemitter 40 such as a PIN diode which, as will be explained in greater detail below, is supplied, in use, with a spin filtered current from the spin filtering device 1 and emits photons that are either left or right circularly polarised, dependent upon the spin polarisation of the spin filtered current.

As shown in FIG. 3, two photodetectors 41a and 41b are provided for detecting photons of the wavelength or band of wavelengths emitted by the photoemitter device 40. Each of the photodetectors 41a and 41b is associated with a polarising filter PF1 and PF2 with the polarising filter PF1 being arranged to transmit only left circularly polarised photons and the polarising filter PF2 being arranged to transmit only right circularly polarised photons. The outputs of the two photodetectors are coupled to a control unit 42.

As will be appreciated, the photodetector 41a will only produce an output when the light from the photoemitter 40 is left circularly polarised while the photodetector 41b will only produce an output when the photons from the photoemitter 40 are right circularly polarised. The control unit which may, for example, comprise a microcontroller can thus provide an output signal indicating the spin polarisation passed by the spin filtering device 1 by determining which of the photodetectors 41a and 41b provides an output. The output device OP shown in FIG. 3 may thus be used to determine the spin polarisation of the current supplied by the spin filtering device 1.

FIG. 4 shows another example of an output device OP' that may be used with the spin filtering device 1. The output device shown in FIG. 4 differs from that shown in FIG. 3 in that a single photodetector 41 is provided and is associated with a single polarising filter PF which is arranged to pass only either left or right circularly polarised light. In this case, the control unit 42 will only receive an output from the photodetector 41 when the photons emitted by the photoemitter 40 are one of left and right circularly polarised but not the other. Accordingly, a two-state device is provided that may be used as, for example, the basis of a memory device with one of the two possible outputs of the photodetector 41 representing "0" and the other representing "1".

As mentioned above, the spin filtering device 1 may be manufactured using standard quantum dot fabrication techniques. The photoemitter 40 will generally be integrated with the spin filtering device to form a photoemissive device.

Figure 5:
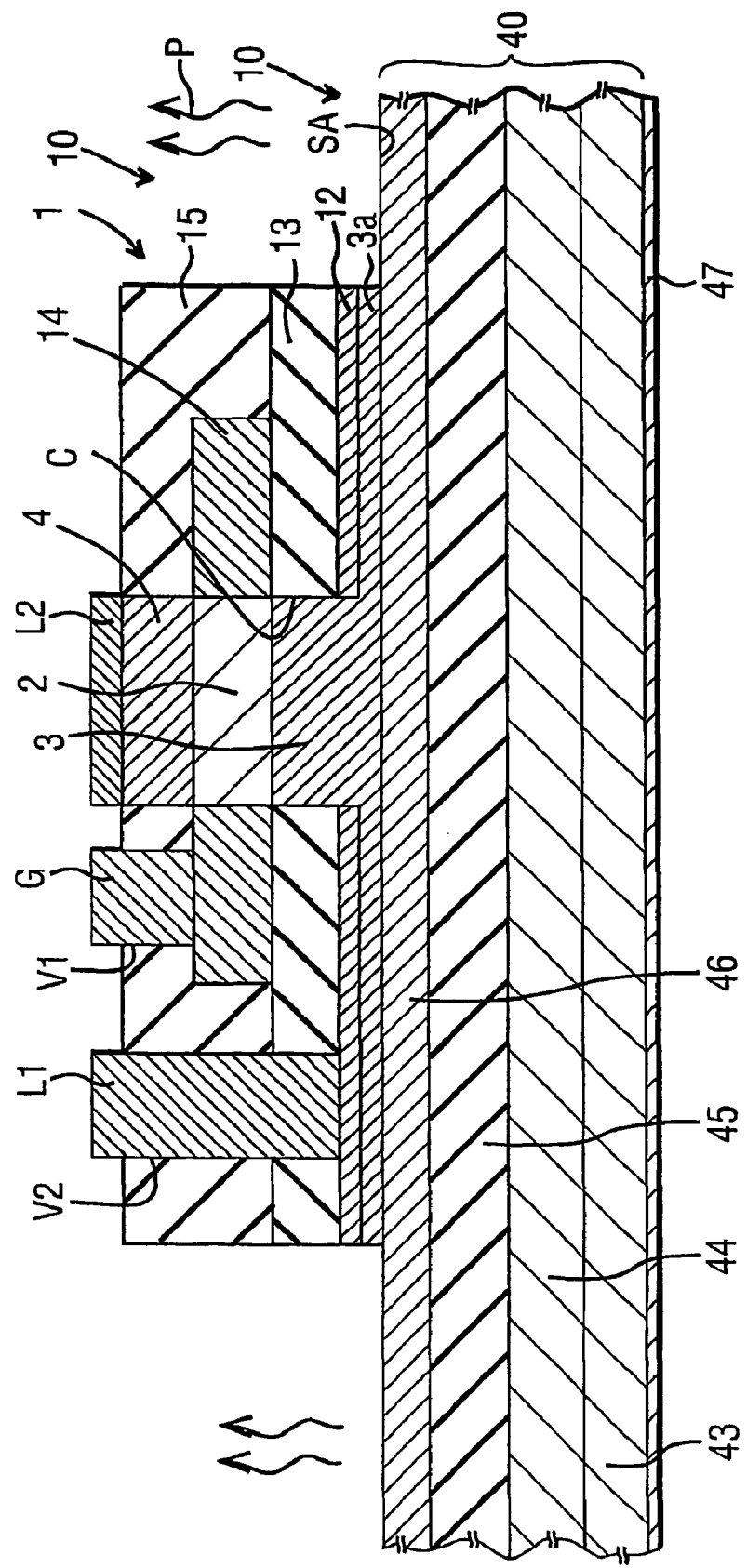
FIG. 5 shows a very diagrammatic cross-sectional view through part of a semiconductor body to illustrate one example of a photoemissive device comprising a spin filter and a photoemitter.

FIG. 5 shows a very diagrammatic cross-sectional view of the part of the semiconductor body 10 to illustrate one example of a photoemissive device.

In this example, the spin filtering device 1 is formed on top of the photoemitter 40. The photoemitter 40 comprises a p conductivity type Gallium Arsenide layer 43 on which is provided a p conductivity Aluminum Gallium Arsenide (AlGaAs) layer 44 followed by an intrinsic (that is not-intentionally doped) Gallium Arsenide layer 45 and an n conductivity type Aluminium Gallium Arsenide layer 46. An electrode 47 contacts the p conductivity type Gallium Arsenide layer 43. The photoemissive device 40 is therefore formed as a PIN diode.

The spin filtering device 1 is then formed by growing alternate layers of, in this example, III–V semiconductors. The Fermi leads 3 and 4 may be formed of Gallium Arsenide which has a g-factor of about −0.44 while the quantum dot region 2 may be formed of Indium Gallium Arsenide which has a g-factor of 15. As another possibility, the quantum dot region 2 may also be formed of Gallium Arsenide. However, the use of Indium Arsenide to form the quantum dot region 2 has the advantage that the g-factor of the quantum dot region 2 will be much higher so that when the spin filtering device 1 is subjected to a DC magnetic field, the Zeeman splitting in the quantum dot will be about 30 times greater than for Gallium Arsenide. This has the advantage that operating temperatures can be about 30 times higher when Indium Arsenide rather than Gallium Arsenide is used to form the quantum dot region 2. A further increase in Zeeman splitting, and thus operating temperature, for the same magnetic field can be achieved by using a magnetic semiconductor to form the quantum dot region 2. For example, the material used may be n conductivity type Beryllium Manganese Zinc Selenide alloy ($Be_xMn_yZn_{1-x-y}Se$) having a composition such that the II–VI material is lattice-matched to the III–V material forming the quantum dot region 2 which is, in this example, n conductivity type Gallium Arsenide (GaAs). Typically the II–VI alloy may have the composition $Be_{0.07}Mn_{0.03}Zn_{0.9}Se$. The use of such a II–VI magnetic material would increase the operating temperature of the spin filtering device again by a factor of 10 which would allow operation at room temperature where the applied magnetic field has a magnitude of a few Tesla and the quantum dot has dimensions of 50 nanometers or less.

The layers deposited on top of the PIN diode 40 are patterned using standard vertical quantum dot defining lithographic techniques to define a column C providing first and second n conductivity type III–V regions defining the Fermi Leads 3 and 4 separated by, as explained above, either another III–V or a II–VI region defining the quantum dot region 2. As can be seen from FIG. 5, the etching process does not continue all the way through the bottom of the lowermost layer deposited onto the PIN diode, rather a portion 3a of that layer remains.

A chromium layer 12 is then deposited to enable ohmic contact to the Fermi lead 3 followed by an insulating material (generally silicon dioxide) layer 13 followed by a further metallic layer (generally chromium) 14 and a further insulating layer 15. Vias V1 and V2 are etched through these layers in known manner and metallisation (again generally chromium) deposited to define the first contact L1 contacting the chromium layer 12, the gate G contacting the chromium layer 14 and the contact L2 contacting the Fermi lead 4.

The entire structure is patterned using standard lithographic techniques to define the spin filtering device 1 as a mesa on top of the PIN diode 40 so that an area SA of the uppermost surface of the n conductivity type Aluminium Gallium Arsenide layer 46 of the PIN diode structure is exposed from which photons P can be emitted during use.

Figure 6:
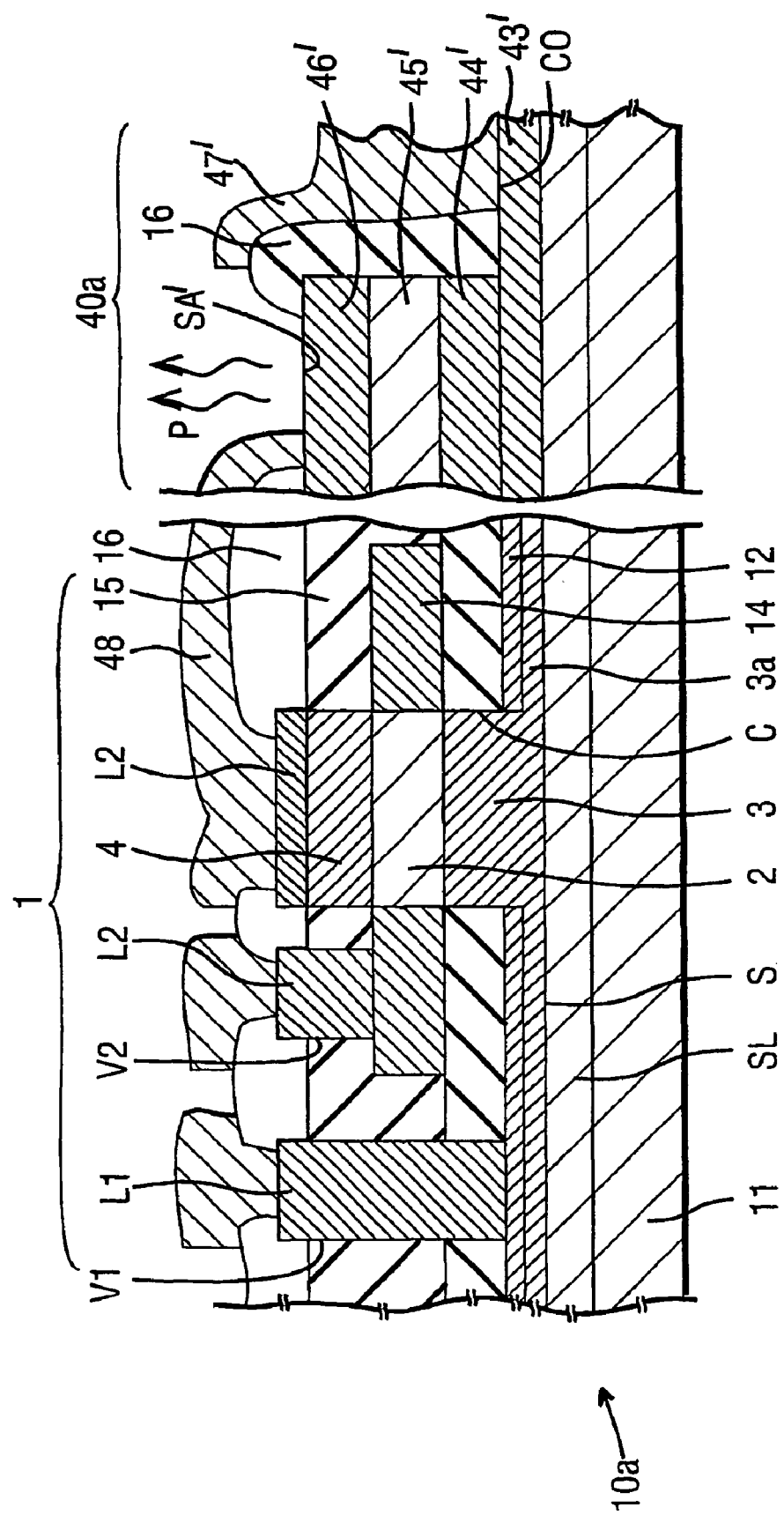
FIG. 6 shows a very diagrammatic cross-sectional view through part of a semiconductor body to illustrate another photoemissive device.

FIG. 6 shows a very diagrammatic cross-sectional view through part of a semiconductor body 10a to illustrate another example of a photoemissive device. In this example, the semiconductor body 10a comprises a substrate 11, generally an intrinsic (that is not intentionally doped) Gallium Arsenide (GaAs) substrate 11, on to which may be grown, as is well known in the MBE and MOCVD art, a Gallium Arsenide|Aluminium Gallium Arsenide superlattice structure SL to provide a clean relatively defect free surface S.

In this example, the spin filtering device 1 has the same structure as shown in FIG. 5. However, the spin filtering device 1 is formed on top of the superlattice SL rather than on top of the PIN diode 40. Using standard lithographic, etching and epitaxial techniques, the PIN diode 40' is also formed on the superlattic SL laterally spaced from the spin filtering device. The PIN diode 40' consists of a p conductivity Aluminium Gallium Arsenide layer 43' followed by a P conductivity type Gallium Arsenide layer 44', an intrinsic Gallium Arsenide layer 45' and an n conductivity type Aluminium Gallium Arsenide layer 46' providing a surface SA' from which photons P may be emitted during use. The layers 44', 45' and 46' are etched to expose a contact region CO of the layer 43' and insulating material 16 and metallisation deposited and lithographically defined to define an electrode 47' contacting the p conductivity type Aluminium Gallium Arsenide layer 43' and an electrode 48 coupling the contact L2 to the n conductivity type Aluminum Gallium Arsenide layer 46'.

It will, of course, be appreciated that FIGS. 5 and 6 are very schematic and that the relative dimensions are not in proportion. In particular, layer thicknesses have been relative exaggerated in these figures and generally the area SA or SA' of the photoemissive surface of the PIN diode 40 or 40' will be much larger than shown. Using standard lithographic techniques, the column C may have a circular cross section with a diameter of about 0.5 micrometers which, as will be understood by the person skilled in the art, is not sufficiently small to define a quantum dot within the quantum dot region 2. However, as well known by person skilled in the art, confinement in the lateral direction in FIG. 5 or 6 may be achieved by applying a voltage to the gate G to define within the quantum dot region 2 a quantum dot having a diameter of about 50 nanometers.

The quantum dot is required to operate in the quantum Coulomb blockade regime which requires that:

$$K_B T \ll \Delta E, e^2/C \tag{1}$$

where $K_B$ is Boltzmann's constant,

T is temperature, $\Delta E$ is the difference between energy levels in a quantum dot, e is the electron charge, C is the capacitance of the quantum dot, and the "," means that the inequality is satisfied for both components on the right hand side, that is:

$$K_B T \ll \Delta E \text{ and } K_B T \ll e^2/C$$

so that tunnelling of an electron onto the quantum dot is only possible when the additional energy $e^2/C$ is applied by, for example, means of a voltage applied to the gate G. For the materials and quantum dot dimensions given above, then the quantised level spacing and Coulomb charging energy will be of the order of 1 mev (milli electron volt) so that, in this example, the device should be operated at liquid Helium temperatures (a few Kelvin) using conventional low temperature generation techniques. It will, however, be appreciated by those skilled in the art that scaling down the size of the quantum dot by a factor of 10 will raise the necessary temperature by a factor of 100 thus allowing operation at room temperature.

Figure 7:
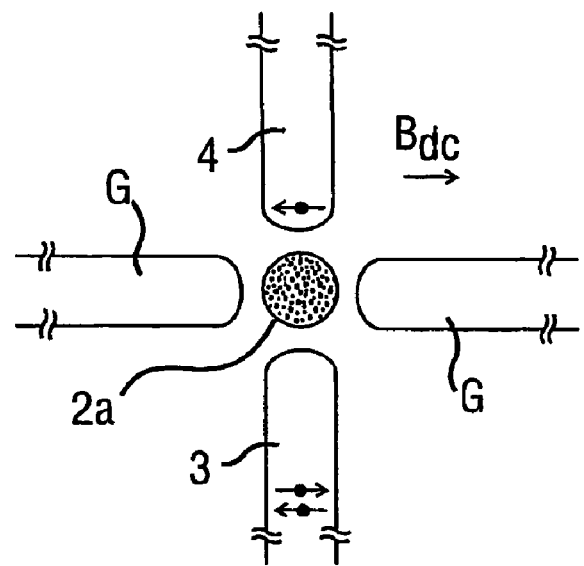
FIG. 7 shows a representational diagram for illustrating the operation of a spin filtering device embodying the invention.

The principle of operation of the spin filtering device 1 shown in FIGS. 1 to 6 will now be described with reference to FIGS. 7 to 14 in which FIG. 7 shows a schematic representation of the device 1 when a voltage has been applied to the annular gate G to provide the necessary further confinement to define a quantum dot 2a within the quantum dot region. FIG. 7 also shows the relative orientation of the DC magnetic field $B_{dc}$ (perpendicular to the leads 3 and 4) when applied by the DC magnetic field generator 5 (FIG. 2).

Figure 8:
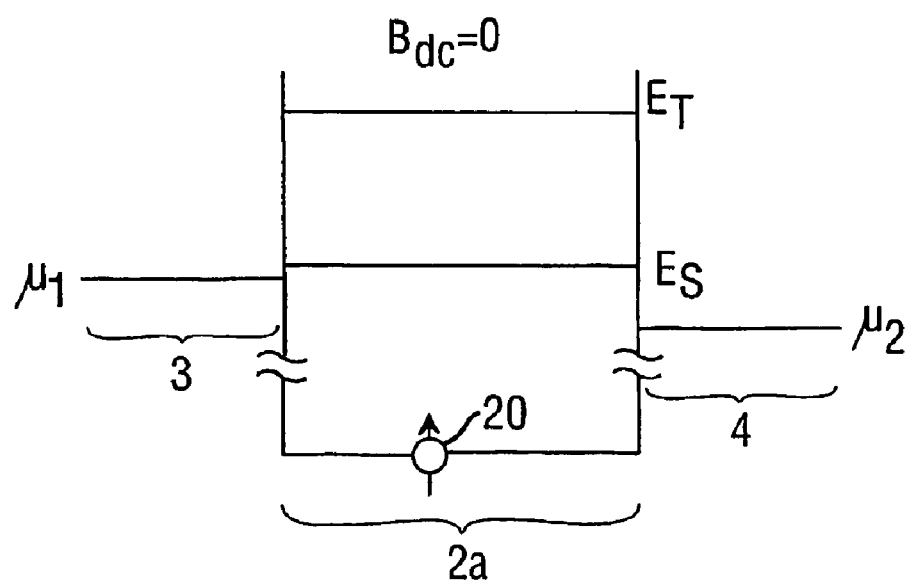
FIGS. 8 to 12 show conduction band energy level diagrams for explaining the principle of operation of a spin filtering device embodying the present invention.

FIG. 8 shows a conduction band energy level diagram for the device 1 when $B_{dc}=0$. In FIG. 8, $\mu_1$ and $\mu_2$ represent the chemical potentials of the Fermi leads 3 and 4 which, in the Coulomb blockade regime with one electron 20 in the uppermost ground state of the quantum dot 2, are related to the voltage $V_{1,2}$ applied between the contacts L1 and L2 as follows:

$$V_{1,2}=(\mu_1-\mu_2)/e \tag{2}$$

FIG. 8 shows for the purpose of illustration the one electron 20 in the uppermost ground state of the quantum dot 2a as having spin state up.

The effect of applying a DC magnetic field $B_{dc}$ to the device 1 will now be explained with reference to the conduction band diagrams shown in FIGS. 9 to 12 and the spin-state diagrams shown in FIGS. 13 and 14.

Applying a DC magnetic field $B_{dc}>0$ in the direction shown in FIGS. 9 to 12 causes, as is well known in the art, lifting of the spin degeneracy of the energy levels and Zeeman splitting between the spin state up and spin state down levels where the Zeeman splitting $\Delta_E$ is given by:

$$\Delta_E = \mu_B |gB| \quad (3)$$

where g is the g-factor of the material, $\mu_B$ is the Bohr magneton and B is the applied DC magnetic field.

As mentioned above, the spin filtering device 1 is configured such that the Zeeman splitting resulting from the applied DC magnetic field is sufficiently large that the Zeeman splitting in the quantum dot 2a is larger than $\Delta\mu$ and larger than KT. The Zeeman splitting in the Fermi leads 3 and 4 is assumed to be much smaller than the Fermi energy and can thus be neglected.

Figure 9:
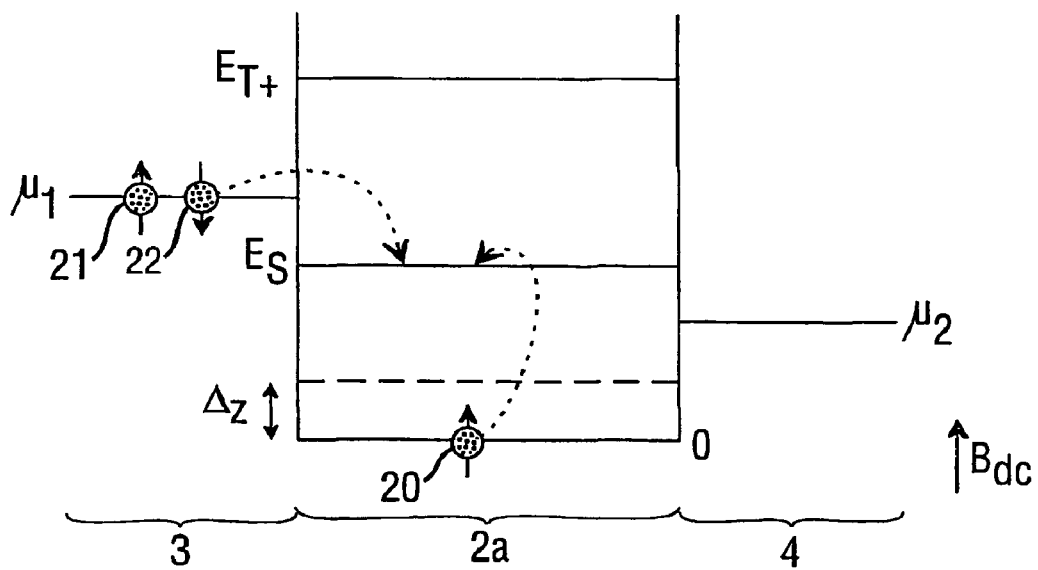

FIG. 9 shows the case where the voltages applied to the spin filtering device 1 cause the quantum dot 2a to contain an odd number, N, of electrons with the uppermost electron 20 in the ground state (which is arbitrarily set to zero in FIGS. 8 to 12 in the interest of convenience) having spin state up. As can be seen from a comparison of FIGS. 8 and 9, when the magnetic field $B_{dC}$ is applied, Zeeman splitting $\Delta_z$ occurs in the ground $E_B$ and triplet energy states only, thus lifting the spin degeneracy.

In FIGS. 8 to 12 the direction of the DC magnetic field $B_{dc}$ is such that the electron 20 in spin state up has a lower energy than would an electron in spin state down. It will, of course, be appreciated that both the singlet $E_S$ and triplet energy levels are split. However, for the sake of convenience, only the lower level $E_{T+}$ triplet state is shown in FIGS. 9 to 12.

In order for a current to flow through the device 1, an electron must tunnel from the Fermi lead 3 onto the quantum dot 2a and an electron must tunnel off the quantum dot 2a onto the Fermi lead 4. Because the quantum dot 2 is in the Coulomb blockade regime, the charge on the dot is quantised in units of electron charge. Also, because the tunnelling coupling is weak, tunnelling between the Fermi leads 3 and 4 and the quantum dot 2a can be described as a perturbation enabling the standard master equation approach to be used to calculate the current in the stationery limit.

Evaluation of tunnelling rates shows that two regimes of transport can naturally be distinguished, namely a sequential tunnelling regime where the number of electrons N on the quantum dot 2a fluctuates between N and N±1 and which is a first order transition which must obey energy conservation and a cotunnelling regime which is of higher order and thus provides a much smaller contribution to the current and in which an electron effectively tunnels directly from one Fermi lead 3 to the other Fermi lead 4 via a virtual state on the quantum dot 2a with the only allowed processes being second order transitions with the initial and final electron number on the quantum dot 2a being the same, namely N.

In order for the device to be in the sequential tunnelling regime, the voltage applied to the gate G is tuned so that the chemical potential $\mu_1$ of the input Fermi lead 3 is comparable to or greater than the energy of the next unoccupied level of the quantum dot 2a while the chemical potential $\mu_2$ of the output Fermi lead 4 is less than or comparable to the energy of that level namely:

$$\mu_1 \geq E_S \geq \mu_2 \quad (4)$$

When $E_S > \mu_1$ and $E_S > \mu_2$ the device is in the co-tunnelling regime where two possible virtual states, a triplet and a singlet state, can be occupied. If N is even then the ground state contains a topmost singlet state with $E_S < \mu_1$ and $E_S < \mu_2$.

Figure 10:
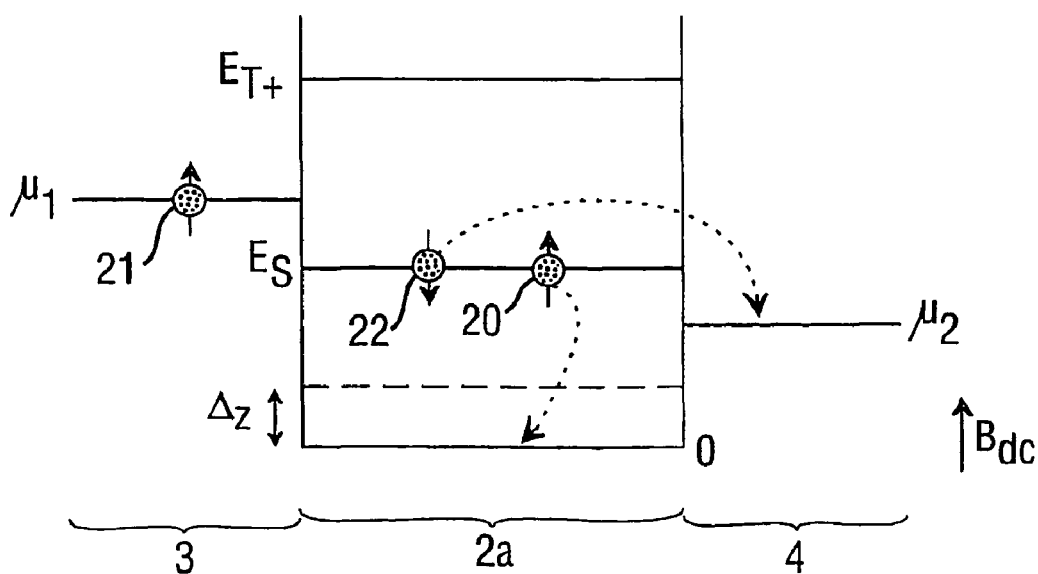
Figure 11:
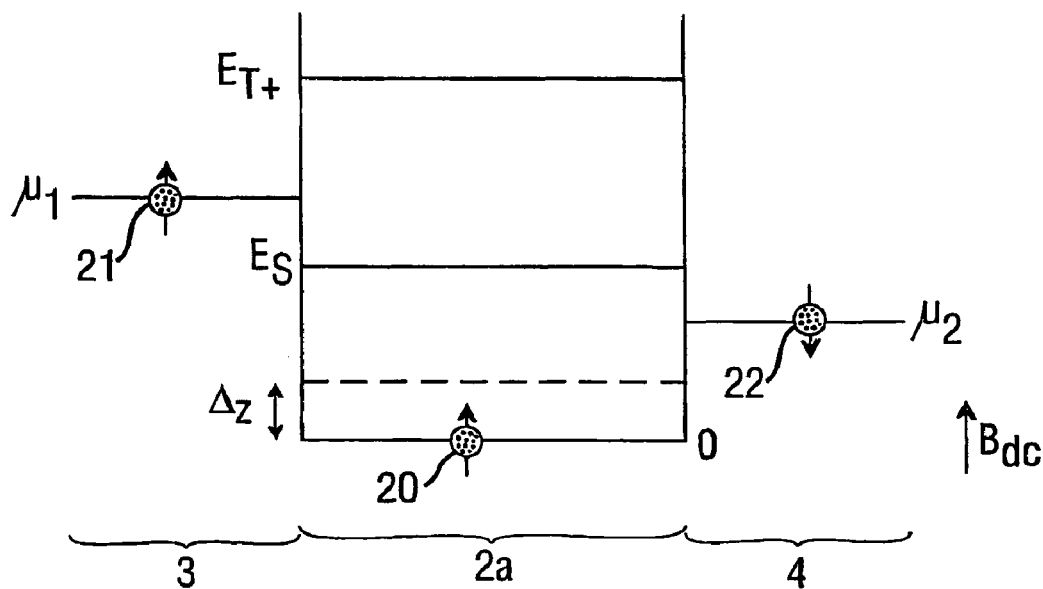

FIGS. 9 to 11 show conduction band diagrams for illustrating tunnelling through the quantum dot 2a where the quantum dot and applied magnetic field are such that the ground state of the quantum dot contains one spin-up state electron 20 and the gate voltage is tuned to bring the device 1 into the sequential tunnelling regime.

The device is configured and operated such that:

$$E_{T+} - E_S, \Delta_Z > \Delta\mu, K_B T$$

where $\Delta\mu = |\mu_1 - \mu_2|$ (5)

where the "," again means that the inequality is satisfied for both components on each side of the inequality that is:

$$E_{T+} - E_S > \Delta\mu, E_{T+} - E_S > K_B T, \Delta_Z > \Delta\mu \text{ and } \Delta_Z > K_B T$$

and thus only ground state transitions are allowed by energy conservation. Therefore, in the situation shown in FIG. 9, because the ground state of the quantum dot 2a already contains an electron 20 with spin state up, a spin-state up electron 21 on the input Fermi lead 3 cannot tunnel into the ground state and accordingly the only possibility is for that electron to tunnel into an excited triplet state. This is, however, forbidden by energy conservation.

In contrast, an electron 22 with spin state down and an energy equal to the additional Coulomb charging energy $e^2/C$ can tunnel onto the dot 2a, thus obeying Fermi's Golden rule. As shown in FIG. 10, this tunnelling of the electron 22 onto the dot ensures that the energy level of the two electrons 22 and 20 is raised to the energy level $E_S$.

Thus, only an electron in a spin-down state can tunnel onto the dot 2a in the sequential tunnelling regime if the uppermost electron on the dot is in the spin-up state. Therefore, in the Coulomb blockade regime the quantum dot 2a blocks tunnelling of spin-up state electrons 21 from the Fermi lead 3 when the uppermost electron on the quantum dot is a spin-up state electron. This process is fundamentally different to previously introduced spin blockade effects such as described by the Wiedmann et al in Physics review letters volume 74, 1995 at page 984 because they occur for non-spin polarised currents and vanish with increasing magnetic fields, in contrast to the effect being discussed here.

Once the spin-down state electron 22 has tunnelled onto the quantum dot 2a then, as shown in FIG. 10, the spin-down state electron 22 can tunnel from the quantum dot 2a onto the lower chemical potential $\mu_2$ output Fermi lead 4 and the spin-up electron 20 returns to its previous energy level as shown in FIG. 11. Because the Zeeman splitting $\Delta_Z > \Delta\mu, K_B T$ tunnelling of the spin-up electron 20 from the quantum dot 2a onto the output Fermi lead 4 is prohibited because otherwise an excited spin would be left on the quantum dot 2a, violating energy conversation.

Figure 13:
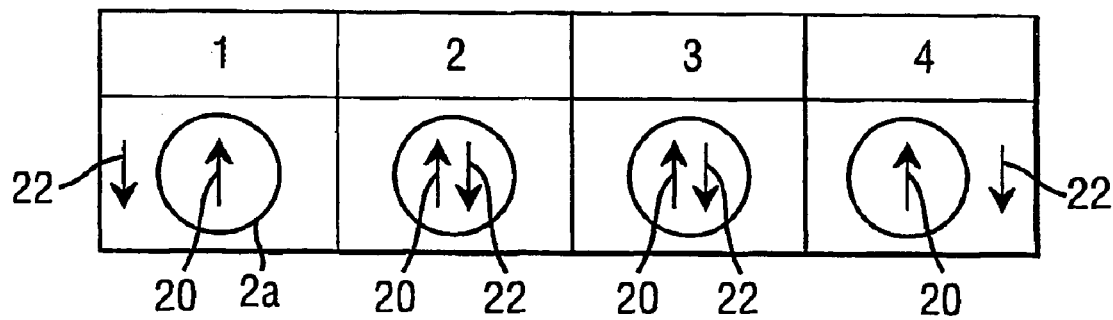
FIGS. 13 and 14 are spin-state diagrams for further assisting the explanation of the principle of operation of a spin filtering device embodying the invention.

FIG. 13 shows a spin state diagram to illustrate the sequential tunnelling process. At step 1, the quantum dot 2a contains a spin-up state electron 20 in its uppermost ground state while the spin-down state electron 22 is on the input Fermi lead 3. At step 2, the spin-down state electron 22 has tunnelled onto the quantum dot. Steps 3 and 4 show the sequence involved in tunnelling of an electron off the quantum dot. Thus step 3 shows the energy level $E_S$ on the quantum dot 2a occupied by the spin-up state electron 20 and the spin-down state electron 22 while step 4 shows the spin-down state electron 22 having tunnelled from the dot 2a onto the output Fermi lead 4 and the spin-up state electron 20 still on the quantum dot 2a but, as shown in FIG. 11, having returned to the uppermost ground state.

As will be appreciated, reversing the polarity of the magnetic field $B_{dc}$ would mean that the electron 20 shown in FIGS. 9 to 11 would be in the spin-down state and therefore tunnelling through the quantum dot 2a of the spin-up state electron 21 shown in FIG. 9 but not of the spin-down state electron 22 would be allowed. The device 1 thus provides a spin filter with the polarisation of electrons that can tunnel through the quantum dot 2a being determined by the spin polarisation of the uppermost electron 20 on the quantum dot.

As described above, the Zeeman splitting in the Fermi leads 3 and 4 is very small compared to the Fermi energy in the leads so that both spin polarisations (up and down) are equally available for transport through the quantum dot 2a. This is the standard situation for typical quantum dot experiments as described in the textbook "Mesoscopic Electron Transport" mentioned above with the Fermi energy in the leads being typically a few hundred degrees Kelvin while the Zeeman splitting is of the order of a few Kelvin at most (for DC magnetic fields of a few Tesla at most).

Figure 12:
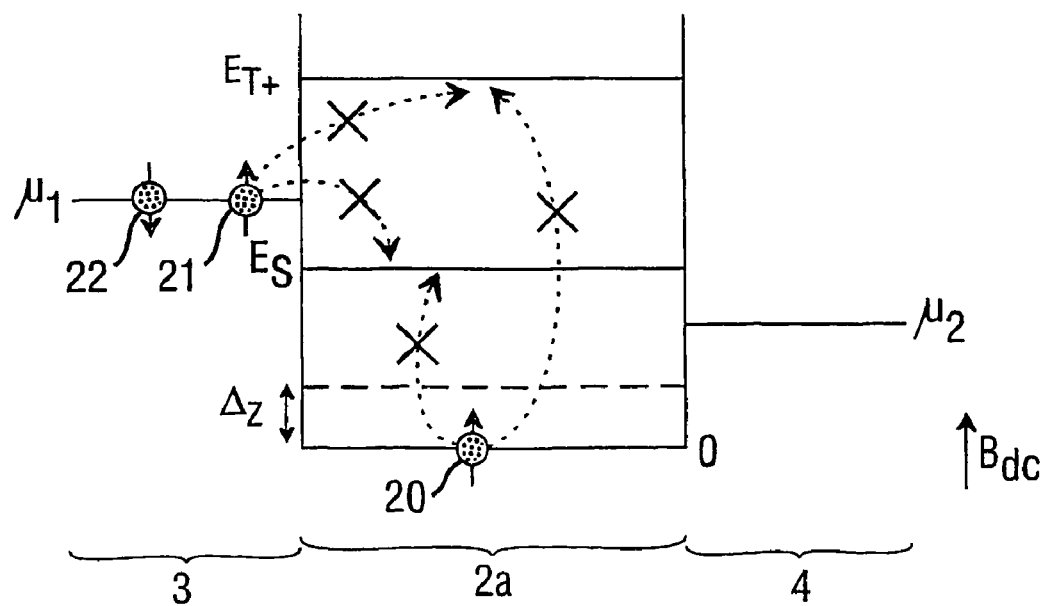

FIG. 12 shows a conduction band energy diagram illustrating the forbidden tunnelling processes for a spin-up electron on the Fermi input lead 3 when the electron 20 in the uppermost ground state on the quantum dot 2a has a spin state up. Thus, tunnelling of the spin-up state electron 21 into the singlet level $E_S$ is forbidden by spin conservation because the electron 20 also has spin state up while tunnelling of the spin state up electron 21 into the triplet level $E_{T+}$ is forbidden by energy conservation.

Above or below a sequential tunnelling resonance tuned by the gate voltage, that is when $E_S$ is greater than the chemical potentials of the input and output Fermi leads 3 and 4 or is less than the chemical potentials of the input and output Fermi leads 3 and 4, the device 1 is in the cotunnelling regime where, as explained above, tunnelling can only occur directly from one lead to the other via a virtual state on the quantum dot.

Figure 14:
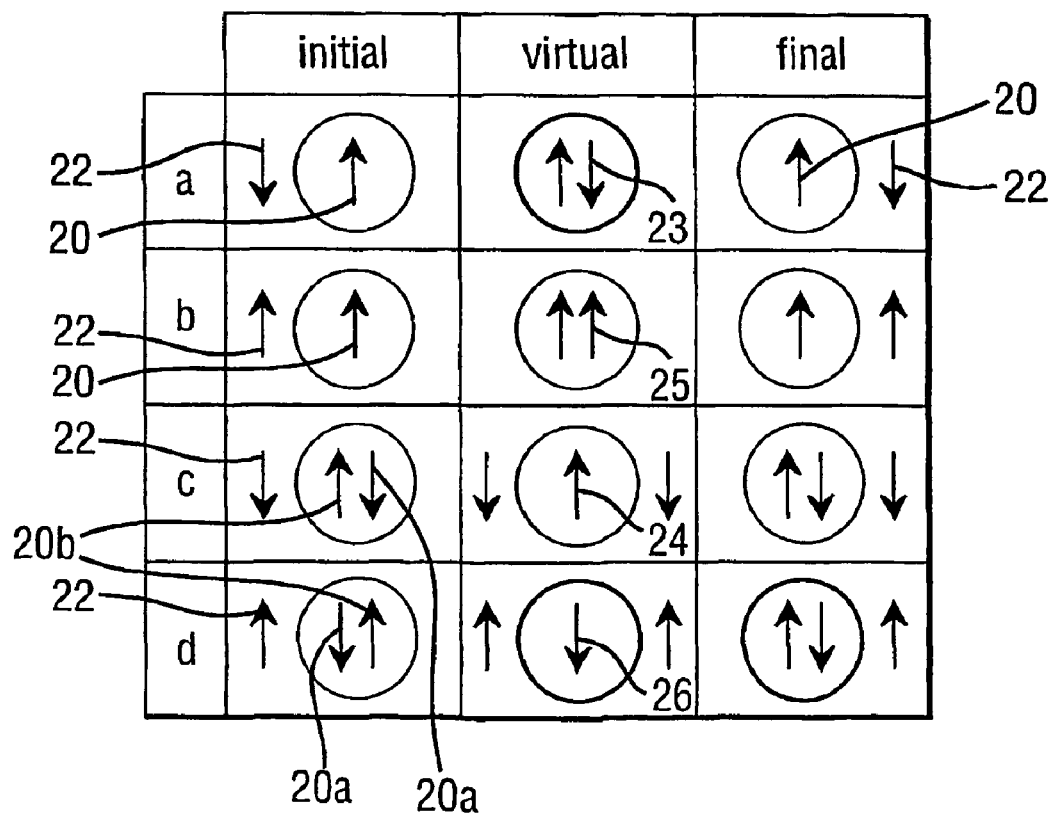

FIG. 14 shows a spin state diagram similar to FIG. 13 where the columns headed "initial", "virtual" and "final" illustrate the situations before, during and after a co-tunnelling process with the rows a, b, c and d illustrating the four different possible co-tunnelling processes. Close to a sequential tunnelling resonance, the main co-tunnelling processes will be those shown in rows a and c where the energy deficit of the virtual states $|\mu-E_S|$ is minimal. In the co-tunnelling process a, where the quantum dot 2a contains a single spin-up state electron 20 in its uppermost ground state, then tunnelling of a spin-down state electron 22 through the quantum dot is via a singlet excited state 23. In the co-tunnelling process shown in row c, N is even and the uppermost ground state of the quantum dot contains a spin-down electron 20a and a spin-up electron 20b and tunnelling of a spin-down state electron 22 through the quantum dot 2a occurs via a virtual spin-up state electron 24. In both these co-tunnelling processes, tunnelling of only spin-down state electrons is allowed as in the sequential tunnelling regime illustrated by FIGS. 9 to 11. Accordingly, these two co-tunnelling processes add to the spin-filtered spin down current.

The additional co-tunnelling processes shown in rows b and d involve tunnelling of spin-up electrons and lead to a leakage of unwanted spin-up electrons. Thus, where the gate voltage is tuned so that N is odd (that is below the resonance) then, as shown in row b, the quantum dot 2a is initially in its ground state with, for the polarisation of the magnetic field $B_{dc}$ shown in FIGS. 9 to 11, its uppermost ground state electron a spin-up state electron 20 and the spin-up state electron 22 on the input Fermi lead 3 tunnels through the quantum dot 2a via a virtual triplet skate |T+>25 with an energy deficit $E_{T+}-\mu$ (where $\mu=(\mu_1+\mu_2)/2$). Above the resonance when N is even and the ground state of the quantum dot 2a is the singlet 20a, 20b, shown in row d, then a spin-up state electron 22 can tunnel through the quantum dot 2a via a virtual spin-down state 26 with an energy deficit $\Delta_Z+\mu-E_S$ (compare this with the energy deficit of the main process which is $\mu-E_S$).

In both cases, that is above and below the resonance, the efficiency (that is the ratio of the required spin-down current to the unwanted spin-up current) can be made very large by tuning the gate voltage and/or the chemical potentials $\mu_1$ and $\mu_2$ back to resonance such that the device eventually returns to the sequential tunnelling regime. The spin filtering is very efficient provided that $\Delta_Z > \Delta\mu, K_B T$. It will be appreciated that inelastic processes and processes where the quantum dot 2a is not in the ground state are suppressed by the Zeeman energy.

The spin polarisation of the filtered current can be reversed by tuning the gate voltage and/or chemical potentials to change the number of electrons N on the quantum dot 2a from odd to even with, for the magnetic field polarisations shown in FIGS. 9 to 12, the filtered current being a spin state down electron current where N is odd and the filtered current being a spin-up state current where N is even.

Reversing the polarity of the magnetic field $B_{dc}$ will cause a reversal in the Zeeman splitting so that where N is odd the uppermost ground state electron will be spin state down and the filtered current will be spin state up while where N is even the filtered current will be spin state down. The spin filtering device thus provides spin-dependent Coulomb blockade peaks that are uniquely associated with a definite spin state on the quantum dot.

The present invention may be used simply to detect the spin state of a quantum dot 2a. However, as explained in the Letter to Nature by Fiederling et al at pages 787 to 789 of volume 402 of Nature published on 16 Dec. 1999 and by Ohno et al at pages 790 to 792 of volume 402 of Nature published on 16 Dec. 1999, a spin-polarised current can be injected into a PIN diode which emits circularly polarised photons with the direction of polarisation (right or left) being dependent on the spin polarisation (up or down) of the injected spin polarised current. A spin filter device embodying the invention may thus be coupled with a photoemitter (as described above with reference to FIG. 5 or 6 for example) to provide a source of photons whose polarisation can be controlled by controlling the spin polarisation of the current transmitted by the spin filtering device.

As explained with reference to FIG. 3, the photoemitter 40 may form part of an output device OP configured to detect separately left and right circularly polarised photons.

The operation of the arrangement shown in FIG. 2 where the output device has the configuration shown in FIG. 3 will now be described with reference to the very schematic diagrams shown in FIGS. 15 and 16 which illustrate very diagrammatically the spin filtering device 1 and its association with the PIN diode 40 or 40a (FIG. 5 or 6).

Figure 15:
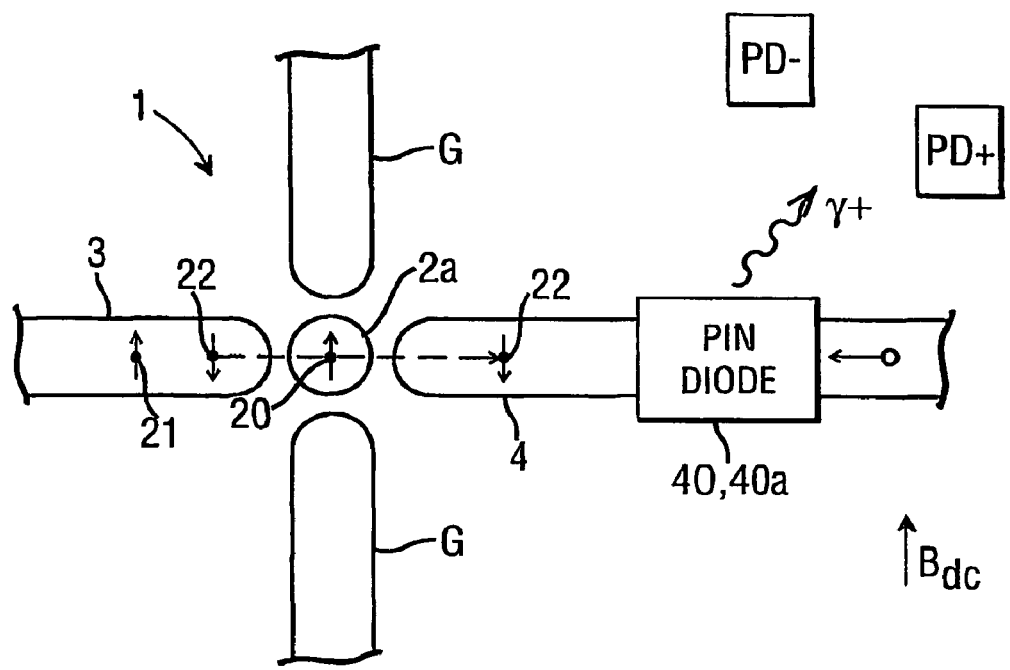
FIGS. 15 and 16 are diagrams for illustrating the operation of a photoemissive device embodying the invention.
Figure 17A:
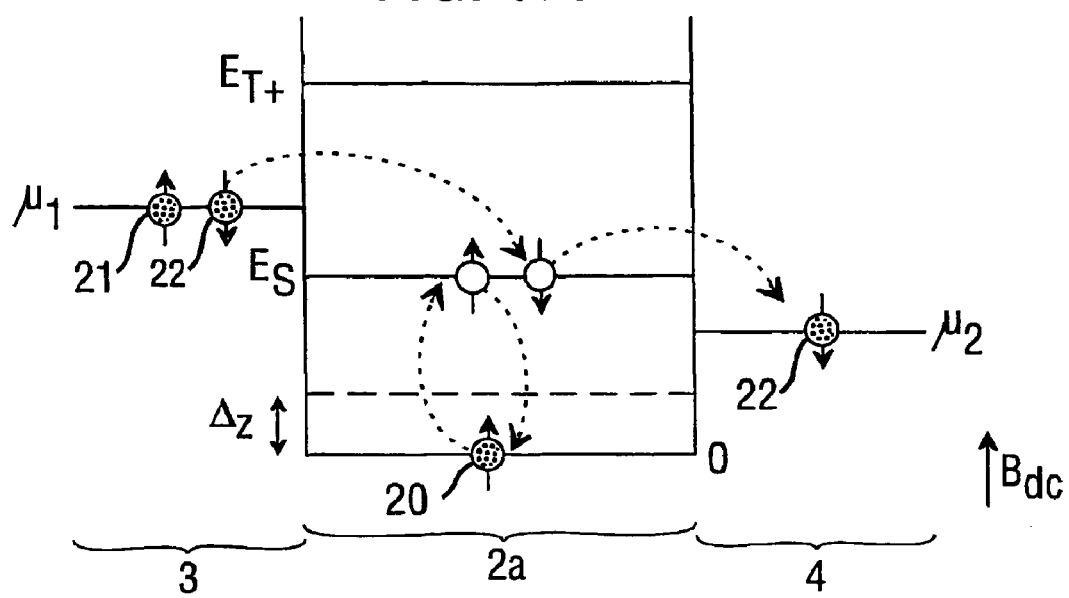
FIGS. 17a and 17b show respective conduction band energy level diagrams for illustrating the effect on a spin filtering device embodying the invention of a reversal of the applied magnetic field.

In the arrangement shown in FIG. 15, the spin filtering device 1 is operated so that the quantum dot 2a is tuned to the sequential tunnelling regime with an odd number of electrons and the DC magnetic field $B_{dc}$ is arranged so that the uppermost electron 20 on the quantum dot has spin state up. With this configuration then, as explained above with reference to FIGS. 9 to 12 and as illustrated in the conduction band diagram shown in FIG. 17a, the spin filter 1 allows sequential tunnelling of a spin down state electron 22 from the Fermi lead 3 via the quantum dot 2a to the output Fermi lead 4. The spin filtering device 1 thus injects a spin-down state current into the PIN diode 40, 40a, which emits, as shown, a photon γ+ which is right circularly polarised. FIG. 15 shows two photodetectors PD− and PD+. The photodetectors PD− and PD+ incorporate, as described above with reference to FIG. 3, respective polarising filters PF1 and PF2 so that the photodetector PD+ can receive only right circularly polarised photons while the photodetector PD− can receive only left circularly polarised photons. In the arrangements shown in FIG. 15, the photons emitted by the PIN diode 40, 40a are thus detected by the photodetector PD+ but not by the photodetector PD−.

Figure 16:
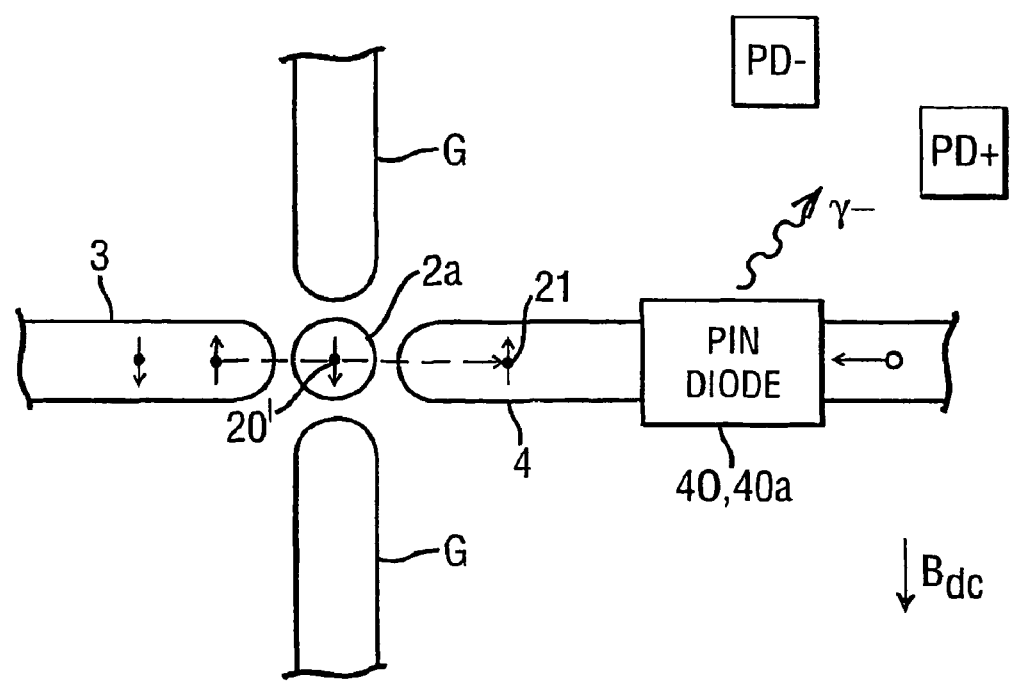
Figure 17B:
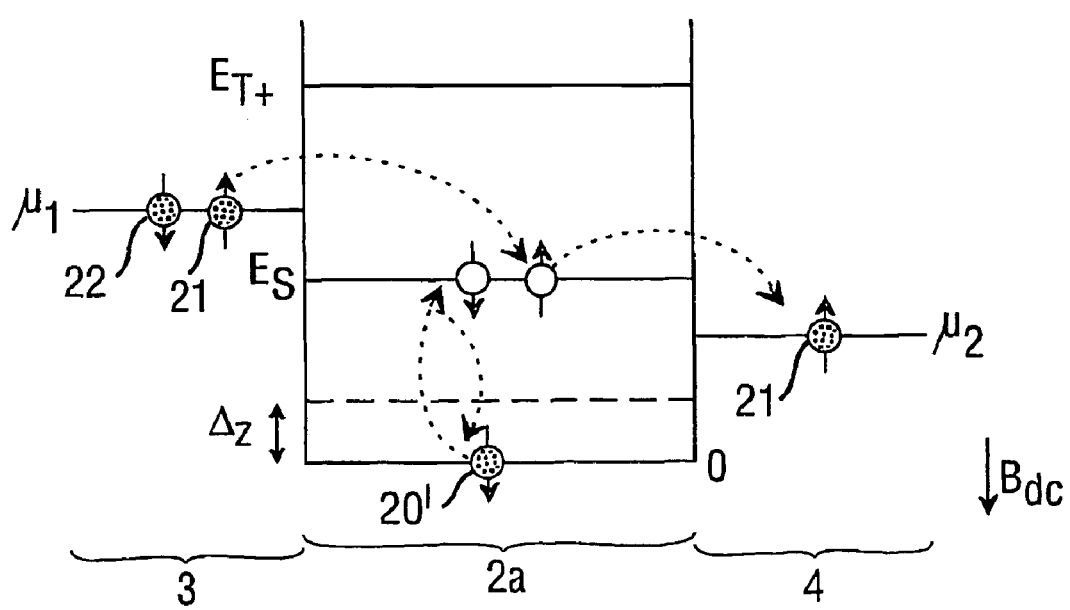

FIG. 16 shows, in contrast, the arrangement where the spin filtering device 1 is again operated in the sequential tunnelling regime such that the quantum dot has an odd number N of electrons but with the magnetic field $B_{dc}$ reversed so that the uppermost ground state electron is a spin-down state electron 20'. In this case, as illustrated in the conduction band energy diagram shown in FIG. 17b, the sequential tunnelling current is by spin-up state electrons 21 and the PIN diode 40, 40a emits left circularly polarised photons γ− which can only be detected by the photodetector PD−.

It will be appreciated that, as described above with reference to FIG. 4, a single photodetector may be provided that is capable of detecting only either γ+ or γ− photons so that the photodetector either provides an output or does not provide an output, dependent upon whether the PIN diode 40, 40a emits γ+ or γ− photons. In either case, the outputs of the photodetectors PD− and PD+ or the single photodetector can be used to represent either "0" or "1", dependent upon the polarisation of the photons, enabling use of the arrangement as a memory device.

As will be appreciated by those skilled in the art, a number of photoemissive devices comprising a spin filtering device 1 and a photoemitter 40, 40a, having, for example, the structure shown in FIG. 5 or 6 may be integrated on the same substrate and coupled so as to provide a two-dimensional memory in which the spin polarisation of the current produced by an individual spin filtering device can be controlled by selecting N to be odd or even or by locally reversing the magnetic field.

Figure 18:
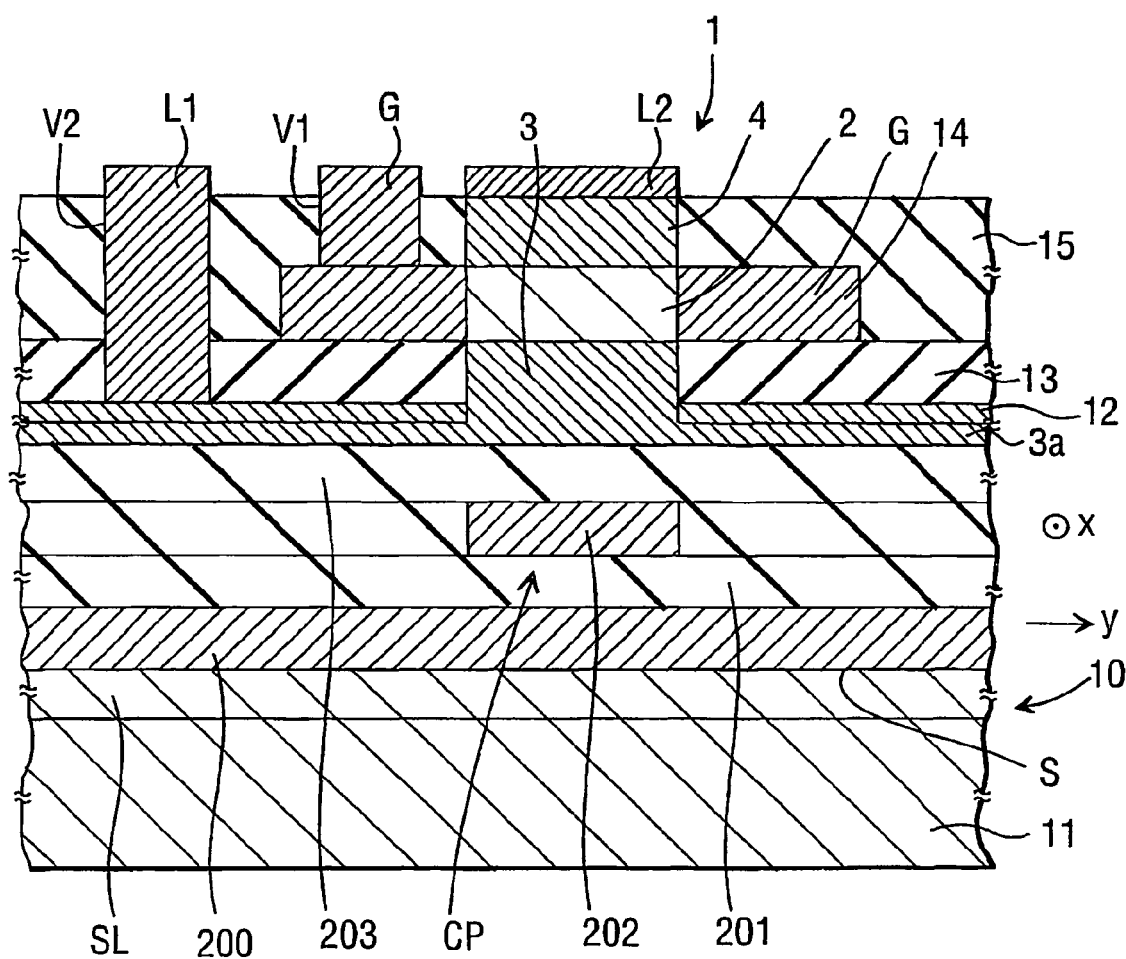
FIG. 18 shows cross-sectional view of part of a semiconductor body illustrating another example of a spin filter embodying the invention.
Figure 19:
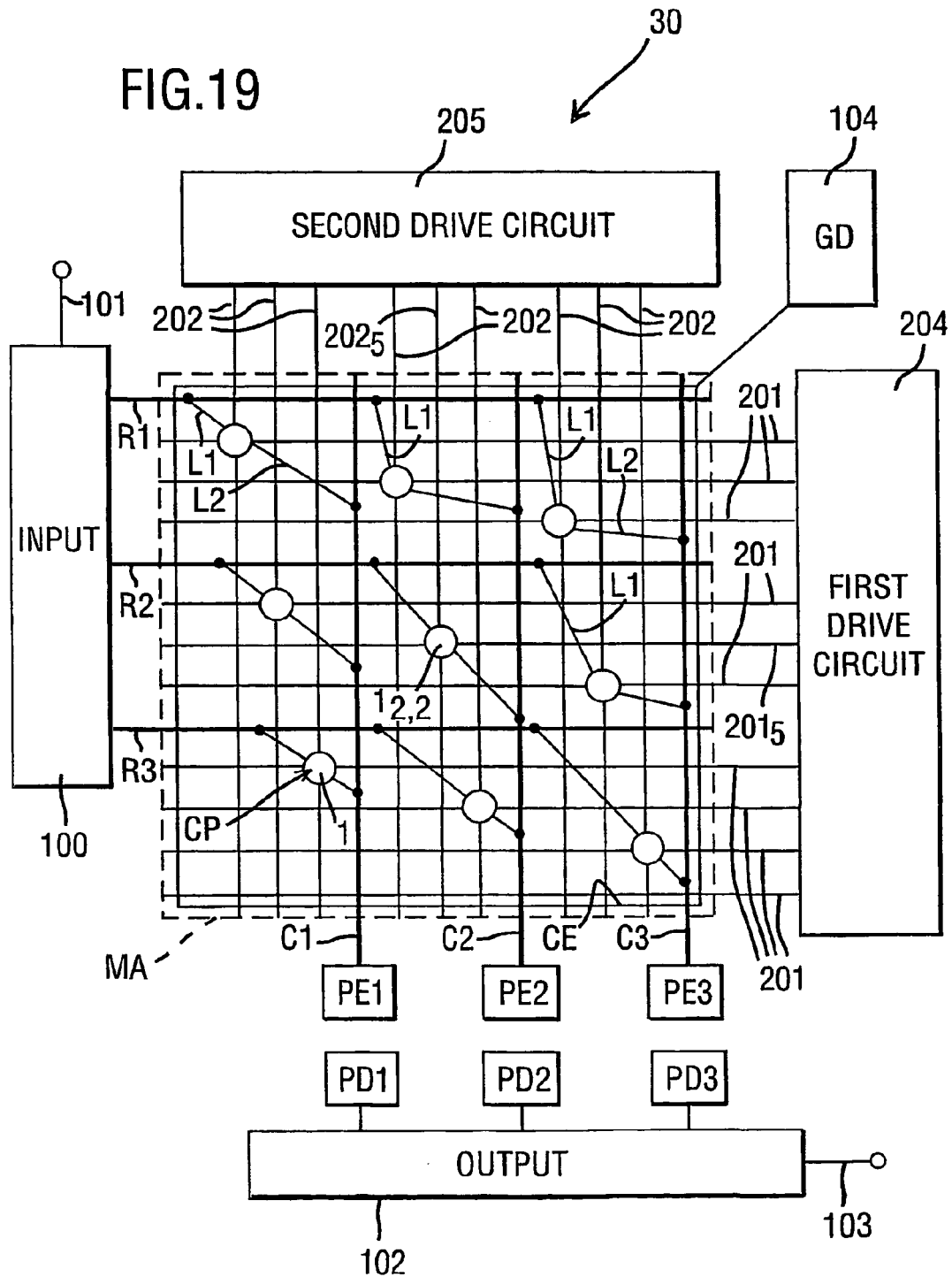
FIG. 19 shows a functional diagram of a two-dimensional memory using the spin filter shown in FIG. 18 as a memory device.

An example of a memory 30 embodying the present invention will now be described with reference to FIGS. 18 and 19 where FIG. 18 shows a cross-sectional view of part of a semiconductor body 10 in which a two-dimensional array MA (FIG. 19) of spin filtering devices 1 is formed and FIG. 19 shows a block diagram of the memory 30 to illustrate addressing of individual spin filtering devices.

FIG. 18 shows a cross-sectional view of part of the semiconductor body carrying a single spin filtering device 1. It will, of course, be appreciated that the semiconductor body will carry a two-dimensional array of such devices extending in rows and columns in the x and y direction shown in FIG. 18 and coupled by row and column conductors R1, R2, R3 and C1 to C3 as shown schematically in FIG. 19. Although FIG. 19 shows a three by three array MA of spin filtering devices, generally the memory will consist of many more such devices.

As can be seen from FIG. 18, the spin filtering devices 1 have the same structure as shown in FIG. 6. However, between the spin filtering devices 1 and the substrate 11 is sandwiched a current grid arrangement consisting of a parallel spaced-apart first conductors 200 extending in the y direction in FIG. 18 and, separated by an insulating layer 201 from the first conductors, parallel spaced-apart of second conductors 202 extending in the x direction in FIG. 18 (that is into the plane of the paper) so that the first and second conductors 200 and 202 are mutually perpendicular.

The second conductors 200 are separated from the memory devices 1 by an insulating layer 203. The insulating layers may, as is known in the art, comprise silicon dioxide or intrinsic Gallium Arsenide.

The mutually perpendicular first and second conductors 200 and 202 are arranged such that each spin filtering device 1 is situated over a crossover point CP between a pair of first and second conductors 201 and 202.

As shown in FIG. 19, the contacts L1 of the Fermi input leads 3 of rows of spin filtering devices 1 are coupled via respective row conductors R1 to R3 to an input shift register 100 having an input 101 for enabling addressing of the row conductors in turn. The contacts L2 of each of the Fermi output leads 4 in a column are coupled to a corresponding column conductor C1 to C3 and a corresponding photoemitter PE1, PE2 or PE3. Each photoemitter consists, in this example, of a PIN diode 40 or 40a as shown in FIG. 5 or 6 integrated on the same substrate as the memory array as described above. Each of the photoemitters PE1, PE2 and PE3 is associated with a corresponding photodetector PD1, PD2 and PD3 arranged to detect only one of left and right circularly polarised photons. The outputs of the photodetectors PD1, PD3 are coupled to an output shift register 102 having an output 103.

In this example, all of the gates G are driven at the same voltage and are coupled via a common electrode CE to a gate drive circuit (GD) 104 as is well known in the art. Each of the first current conductors 201 is coupled to a first drive circuit 204 while each of the second conductors 202 is coupled to a second drive circuit 205.

As can be seen in FIG. 19, the pitch of the first and second current conductors 201 and 202 is smaller than that of the row and column conductors such that each device 1 is uniquely associated with a pair of first and second conductors 201 and 202. Thus, for example, the spin filtering device $1_{22}$ (where the $_{22}$ indicates that the spin filtering device is in the second row and the second column) is coupled to the fifth first conductor $201_5$ and the fifth second conductor $202_5$.

In the embodiment shown by FIGS. 18 and 19, the current grid first and second drive circuits 204 and 205 are used to adjust the applied magnetic field locally for a particular spin filtering device. This is achieved by supplying to the first and second conductors 201 and 202 uniquely associated with the selected device (for example, first conductor $201_5$ and second conductor $202_5$ for the device $1_{22}$) currents which individually are insufficient but which together provide a magnetic field sufficient to cause Zeeman splitting at the spin filtering device $1_{22}$ of the required polarity.

The currents supplied by the first and second drive circuits 204 and 205 to the first and second conductors 201 and 202 will be such that the polarity of the local DC magnetic field at each spin filtering device 1 can be either one direction or the other and the memory array is operated so that the quantum dot 2a are in the sequential tunnelling regime so that dependent upon the local magnetic field, a spin filtering device will pass either a spin-up or a spin-down current.

A separate DC magnetic field generator may be provided to generate a constant DC magnetic field over the entire array and the current grid first and second driving circuits 204 and 205 may then be used to modify the DC magnetic field locally to provide the required Zeeman splitting.

The spin filtering devices 1 in a column can be accessed sequentially by addressing the two conductors in sequence in known manner so that, each time a spin filtering device 1 is addressed, the photoemitter coupled to the corresponding column, for example, the photoemitter PE2 for the spin filtering device $1_{2,2}$ will emit photons which are circularly polarised in a direction dependent upon the spin state of the uppermost odd electron on the corresponding quantum dot.

The photodetectors PD1, PD2 and PD3 in FIG. 19 are configured so as to detect photons of only one circular polarisation. Accordingly, a photodetector for example, the photodetector PD2 where the spin filtering device being read is the device $I_{2,2}$, will either output a signal or not dependent upon the polarisation of the photons emitted by the photoemitter PE2 which will, in turn, depend upon the spin polarisation of the current transmitted by the spin filtering device 1,2.

As is well known in the memory addressing art, the individual spin filtering devices may be addressed in turn and each will provide a signal representing either a 0 or 1, dependent on the spin polarisation of the current supplied by the corresponding quantum dot.

Figure 20:
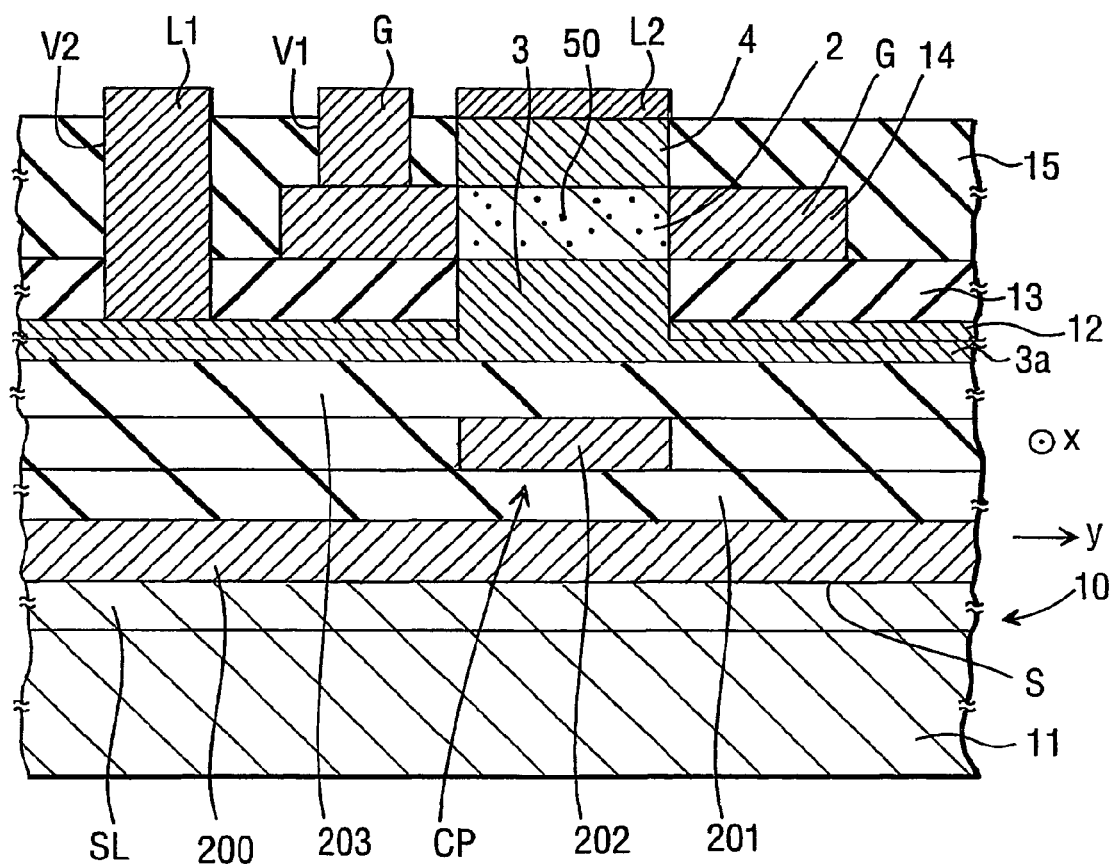
FIG. 20 shows a cross-sectional view similar to FIG. 18 for illustrating a modification of the arrangement shown in FIG. 18.

FIG. 20 shows a cross sectional view similar to FIG. 18 of a modification of the arrangement shown in FIG. 18. As shown very diagrammatically in FIG. 20, an additional magnetic element in the form of a magnetic impurity 50 such as manganese is incorporated into the quantum dot region 2. As other possibilities, the additional magnetic element may be a hard magnetic layer or magnetic nanoparticles or a magnetic STM (scanning tunnelling microscope) tip. The magnetic field from the additional magnetic element controls the Zeeman splitting at the quantum dot and the magnetic coercivity is such that the underlying current grid 201, 202 can be used to switch the magnetisation direction of the additional magnetic elements so as to reverse the Zeeman split energy levels (that is changing the spin-down ground state into a spin-up ground state or vice versa) and therefore allowing for a fully non-volatile memory system. As another possibility, the additional magnetic element may be replaced by a layer of nuclear spins providing an Overhauser field which may be switched using standard nuclear magnetic resonance (NMR) techniques.

It will be appreciated that the applied local magnetic field need not be confined to the area of the quantum dot 2a because the spin filtering devices are designed and configured so that the magnetic field has a negligible effect on the electrons in the Fermi leads 3 and 4. The local magnetic field should, of course, however, be confined so that it is does not influence the quantum dots of adjoining spin filtering devices.

In the embodiments described above with reference to FIGS. 18 to 20, each individual spin filtering device 1 is uniquely addressed by the first and second drive circuits 204 and 205. However, a multiplexing drive scheme may be used so that a memory 31 embodying the invention has the layout shown in FIG. 21. This differs from that shown in FIG. 19 in that a single conductor 201 is provided for each row R1 to R3 of spin filtering devices and a single second conductor 202 is provided for each column C1 to C3 of spin filtering devices and a multiplexing drive arrangement is used to both address and read the spin filtering devices so that only one device is addressed or read at a time, that is only one conductor 201 and only one conductor 202 is active at any one time, to avoid cross talk problems between adjacent devices. As will be appreciated, instead of providing the perpendicular arrays of conductors 201 and 202 as shown in FIGS. 19 and 21, each spin filtering device 1 may be individually addressed by a single conductor capable of locally controlling the same magnetic field at that spin filtering device.

The spin filtering devices described above may be implemented using other materials meeting the conditions set out above.

As described above, the spin filtering device may be fabricated so that the dimensions of the quantum dot are about 50 nanometres which requires operation at very low temperature (typically liquid Helium temperature, that is a few Kelvin). However, the operating temperature increases dramatically with reduction in the quantum dot size so that, for example, a scaling down of the dot size by a factor of 10 would increase the temperature required by a factor of 100 allowing room temperature operation. As will be appreciated by those skilled in the art, Cadmium Selenide (CdSe) nanocrystals have been fabricated with a dot diameter of 6 nanometres and a Coulomb charging energy of 30 millielectron volts. Couloumb blockade behaviour has also been seen at high temperature in $C_{60}$ molecules and in carbon nanotubes (see for example the aforementioned text book entitled "Mesoscopic Electron Transport" by Sohn et al). Indeed, there is no fundamental physical discontinuity between a quantum dot and a large molecule or even atom and thus the present invention may also be applied to such quantum-confined nanostructures or regions.

Where size constraints make contact difficult then, in the embodiments described above, scanning tunnelling electron microscope (STM) techniques may be used to address and read the state of a spin filtering device. For example, where necessary, addressing and read out of a memory array may be achieved using microscopic arrays of scanning tunnelling tips that are atomically sharp so that operation at a molecular or even atomic level may be possible.

As described above, the Zeeman splitting of the quantum dot:

$$\Delta_Z = |E\uparrow - E\downarrow| = \mu_B |gB| \quad (1)$$

where $E\uparrow$ and $E\downarrow$ represent the energy of the up and down spin states, enables splitting of up and down spin states. The g-factor magnetic field, applied bias:

$$\Delta\mu = |\mu_1 - \mu_2| \quad (2)$$

and temperature $K_B T$ must be such that oniy ground state transistions are allowed which is the case where:

$$E_{T+} - E_S, \Delta_Z > \Delta\mu, K_B T \quad (3)$$

In operation of a spin filtering device embodying the invention, only electrons with a specific spin state (for example spin state down) can tunnel through the quantum dot 2a and therefore the output Fermi lead 4 will contain mainly electrons of that spin state with a smaller number of electrons of the opposite spin state being present due to the filled Fermi sea. The electrons tunnelling through the quantum dot will stay spin polarised despite the presence of the Fermi sea for microscopic distances exceeding 100 micrometres (µm) in material such as Gallium Arsenide as reported by D Awschalom and J Kikkawa in Physics Today volume 52 at page 33 (1999) and in Nature volume 397 at page 139 (1999). This distance is sufficiently long for the applications described above.

The requirement that:

$$\Delta_Z > K_B T \quad (4)$$

can be relaxed if desired for the following reasons. Thus, if:

$$\Delta_Z < K_B T (<\text{level spacing}) \quad (5)$$

then the two lowest spin states (spin-up and spin-down) on the quantum dot become almost equally populated and it can easily be shown that the ratio of occupation probabilities for spin-up (ground state for the magnetic field direction shown in FIGS. 9 to 12) and spin-down (excited state for the magnetic field direction shown in FIGS. 9 to 12) is:

$$1+\Delta_Z/K_BT \quad (6)$$

which, consequentially, represents the ratio of spin-up to spin-down current in the output Fermi lead 4. Thus the spin filtering effect becomes very small for:

$$\Delta_Z/K_BT \ll 1 \quad (7)$$

However, it may still be possible to detect this imbalance between the spin-up and spin-down currents using PIN diodes and photodetectors as described above given that ohno et al were able to detect an imbalance of up and down currents of a few percent as reported in the above mentioned Letter to Nature. Accordingly, an imbalance in the spin-up/spin-down current should be detectable with $K_BT$ being up to 50 times larger than the Zeeman splitting $\Delta_Z$ on the quantum dot. Using for the quantum dot a material having a g-factor of 15 such as Indium Arsenide as described above and appropriately selecting the quantum dot dimensions should therefore easily enable operating temperatures approaching room temperatures to be achieved.

As described above, a spin filtering device embodying the invention may be used to detect the spin state of a quantum dot, as a current spin polarity switch, to control the circular polarisation of light emitted by a photoemissive device, and to form a memory device. A spin filtering device embodying the invention may also be used to provide spin polarised electrons for magnetic spin transistors by replacing the ferromagnetic source electrodes.

A spin filtering device embodying the present invention may also be used as a source of spin polarised electron for a non-volatile spin memory device described in the applicant's copending PCT application (Our Ref: 1841099) where the non-volatile spin memory device consists of first and second Fermi Leads separated by a 3-dimensionally quantum confined region or quantum dot arranged to operate in the Coulomb blockade region whereby electrons can pass from the input lead to the output lead only by tunnelling through the quantum dot. As so far described, this spin memory device is similar to the spin filtering device described above. However, in complete contrast to the spin filtering device described above, in this spin memory device, the Fermi leads and quantum dot are formed such that, when the spin memory device is subject to a DC magnetic field, the Zeeman splitting in the Fermi leads is very much larger than that in the quantum dot and, moreover, sufficient to cause spin polarisation in the Fermi leads so that conduction through the Fermi leads is by electrons of one spin polarity only. The tunnelling current through this memory device may be controlled by controlling the spin polarisation of an uppermost electron in the quantum dot, by, for example, applying an AC magnetic field pulse for causing a Rabi spin flop in the quantum dot when the Zeeman splitting in the quantum dot is such that a resonance with the AC magnetic field pulse occurs. This memory device may be formed as a non-volatile memory device by incorporating an additional magnetic element into the quantum dot in a manner similar to that described above and a two-dimensional array of such memory devices may be provided which may be addressed and read in a manner similar to that described above with reference to FIGS. 19 and 21 with the photoemitters and photodetectors shown in FIGS. 19 and 21 being replaced by sense amplifiers. As described in the above copending application, the spin polarised current in the input and output Fermi leads are provided by forming these leads of a magnetic II–VI semiconductor material such as, for example, a Beryllium Manganese Zinc Selenide alloy having the composition $Be_xMn_yZn_{1-x-y}Se$ where, for example, x=0.07 and y=0.03 and, in this case, forming the quantum dot of a III–V non magnetic material such as Gallium Arsenide. This spin memory device, may, however, be modified by replacing the input Fermi lead with a spin filtering device embodying the present invention so as to provide the required spin-polarised current for the memory device.

A spin filtering device embodying the present invention may also be useful for quantum computation where the logic element consists of a quantum bit or qubit. In this case, detection of a single electron spin by a spin filtering device would be required for the read out via a well known SET device which detects a single electron charge if its associated spin is such that it is allowed to tunnel via the spin filtering device into the SET. A readout mechanism for a qubit has been proposed by Loss and DiVincenzo in Physical Review A volume 15 at page 120 (1998).

In a spin filtering device embodying the invention the spin state of a quantum dot allows a well-defined spin polarisation component to be filtered. The device operates at a single spin level and may be fabricated with length scales of 10 to 50 nanometers using the materials described above and conventional MOCVD or MBE techniques as described in the aforementioned textbook by Sohn et al.

Although the above described embodiments show vertical spin filtering devices and PIN diodes, they may be produced in lateral configuration and on semiconducting or insulating substrates. For example, a lateral spin filtering device may be provided by confining a two-dimensional electron gas using electrodes as described with reference to, for example, FIG. 1.3 in the chapter entitled "Electron Transport in Quantum Dots" in the aforementioned textbook by Sohn et al.

Spin filtering devices embodying the present invention may be used in, for example, quantum computation and communication where manipulation of electron spin is required or may be used in conventional computing environments to, for example, replace conventional hard drives. Also, very fast switching arrays of such devices may allow very fast switching with potentially large resistance ratios of low and high power industrial machinery.

Memory devices and switches embodying the present invention also have applications in the area of opto-electronics enabling production of, for example, hybrid spin and optical electronic devices and in tagging and tracking applications.

The invention claimed is:

1. A spin filtering device comprising:
   a spin filter having an input region for carrying a current, an output region for carrying a current, and a three-dimensionally quantum confined region arranged to operate in the Coulomb blockade regime and separating the input and output regions whereby charge carriers can only pass from the input region to the output region by tunneling through the quantum region;
   Zeeman splitting means for causing Zeeman splitting in the spin filter such that the Zeeman splitting in the input and output regions is less than the Fermi energy such that, in operation, the spin filter outputs a tunneling current predominantly of one spin polarity.

2. A spin filtering device according to claim 1, wherein the Zeeman splitting means comprises means for applying a DC magnetic field to the quantum region.

3. A spin filtering device according to claim 1, further comprising control means for controlling the predominant spin polarity of the tunneling current.

4. A spin filtering device comprising:
a spin filter having an input region for carrying a current, an output region for carrying a current, and a three-dimensionally quantum confined region arranged to operate in the Coulomb blockade regime and separating the input and output regions whereby charge carriers can only pass from the input region to the output region by tunneling through the quantum region;
Zeeman splitting means for causing Zeeman splitting in the spin filter such that the Zeeman splitting in the input and output regions is less than the Fermi energy such that, in operation, the spin filter outputs a tunneling current predominantly of one spin polarity; and
control means for controlling the predominant spin polarity of the tunneling current, wherein the quantum region has a gate and the control means comprises means for controlling at least one of a gate voltage and a voltage between the input and output regions to control whether the quantum region contains an odd or even number of electrons.

5. A spin filtering device according to claim 4, wherein the control means is arranged to control the direction of Zeeman splitting.

6. A spin filtering device according to claim 4, wherein the Zeeman splitting means comprises means for applying a DC magnetic field to the spin filter, and control means are provided for controlling the predominant spin polarity of the tunneling current by controlling the polarity of the DC magnetic field.

7. A spin filtering device according to claim 4, wherein the quantum region is associated with a magnetic element.

8. A spin filtering device according to claim 4, wherein the quantum region is associated with a magnetic element and the control means is arranged to control the polarization of the magnetic element.

9. A spin filtering device according to claim 8, wherein the magnetic element comprises a magnetic impurity within the quantum region.

10. A memory comprising a spin filtering device in accordance with claim 4 and detecting means for detecting the predominant spin polarization of a current supplied by the spin filtering device.

11. A switching device comprising:
a spin filtering device in accordance with claim 4 and switching means for enabling switching of the spin filter between a first Zeeman split state in which the Zeeman splitting is in one direction and thus the predominant spin polarization of the tunneling current is one of spin state up and spin state down and a second Zeeman split state in which the Zeeman splitting is in the opposite direction and thus the predominant spin polarization of the tunneling current is the other of spin state up and spin state down.

12. A photo emissive device, comprising:
a spin filter having an input region for carrying a current, an output region for carrying a current, and a three-dimensionally quantum confined region arranged to operate in the Coulomb blockade regime and separating the input and output regions whereby charge carriers can only pass from the input region to the output region by tunneling through the quantum region;
Zeeman splitting means for causing Zeeman splitting in the spin filter such that the Zeeman splitting in the input and output regions is less than the Fermi energy such that, in operation, the spin filter outputs a tunneling current predominantly of one spin polarity; and
a photo emitter coupled to receive a spin polarized current from the spin filtering device and to emit photons having a polarization dependent on the spin polarization of the current supplied by the spin filtering device.

13. A spin state detecting device, comprising a photo emissive device according to claim 12, and a photo detecting means for detecting photons of a predetermined polarization.

14. A spin state detecting device, comprising a photo emissive device according to claim 12, wherein the photo emissive device is adapted to emit left or right circularly polarized photons dependent on the spin polarization of the spin polarized current from the spin filtering device and first and second photo detectors are provided for detecting, respectively, left and right circularly polarized photons.

15. A switching device comprising:
a spin filtering device in accordance with claim 12 and switching means for enabling switching of the spin filter between a first Zeeman split state in which the Zeeman splitting is in one direction and thus the predominant spin polarization of the tunneling current is one of spin state up and spin state down and a second Zeeman split state in which the Zeeman splitting is in the opposite direction and thus the predominant spin polarization of the tunneling current is the other of spin state up and spin state down.

16. A memory comprising:
a two-dimensional array of spin filters each having an input region for carrying an electron current, an output region for carrying an electron current, and a three-dimensionally quantum confined region arranged to operate in the Coulomb blockade regime and separating the input and output regions whereby electrons can only pass from the input region to the output region by tunneling through the quantum region;
Zeeman splitting means for causing Zeeman splitting in the spin filters, the quantum region and input and output regions being formed such that the Zeeman splitting in the input and output regions is less than the Fermi energy such that the tunnelling current supplied, in operation, by the spin filter is predominantly of one spin polarity;
control means for controlling the Zeeman splitting within an individual spin filter to control the predominant spin polarization of the tunneling current through that filter;
addressing means for individually addressing each spin filter; and
read-out means for detecting the predominant spin polarization of the current supplied by an addressed spin filter.

17. A memory according to claim 16, wherein the read-out means comprises a photo emitter arranged to receive a spin polarized current from a spin filter and to emit photons having a polarization dependent on the spin polarization of the current supplied by the spin filter.

* * * * *